(12) United States Patent
Sohn et al.

(10) Patent No.: US 6,395,582 B1
(45) Date of Patent: May 28, 2002

(54) METHODS FOR FORMING GROUND VIAS IN SEMICONDUCTOR PACKAGES

(75) Inventors: Ju Yung Sohn, Inchon; Seung Ryul Ryu, Seoul, both of (KR); Marcos Karnezos, Menlo Park, CA (US)

(73) Assignee: Signetics, Seoul (KR)

( * ) Notice: Subject to any disclaimer, the term of this patent is extended or adjusted under 35 U.S.C. 154(b) by 0 days.

(21) Appl. No.: 09/422,212

(22) Filed: Oct. 19, 1999

(Under 37 CFR 1.47)

Related U.S. Application Data

(63) Continuation-in-part of application No. 08/892,471, filed on Jul. 14, 1997, now Pat. No. 6,020,637.

(51) Int. Cl.[7] .................... H01L 21/44; H01L 21/48; H01L 21/50

(52) U.S. Cl. ................ 438/111; 438/122; 438/124; 438/612

(58) Field of Search ............... 438/111, 122, 438/124, 612

(56) References Cited

U.S. PATENT DOCUMENTS

| | | | |
|---|---|---|---|
| 5,240,588 A | 8/1993 | Uchida | 205/125 |
| 5,397,921 A | 3/1995 | Karnezos | 257/779 |
| 5,420,460 A | 5/1995 | Massingill | 257/693 |
| 5,455,456 A | 10/1995 | Newman | 257/704 |
| 5,583,378 A | 12/1996 | Marrs et al. | 257/710 |
| 5,633,533 A | 5/1997 | Andros et al. | 257/707 |
| 5,640,047 A | 6/1997 | Nakashima et al. | 257/738 |
| 5,663,530 A | 9/1997 | Schueller et al. | 174/260 |
| 5,710,459 A | 1/1998 | Teng et al. | 257/717 |
| 5,739,581 A | 4/1998 | Chillara et al. | 257/668 |
| 5,832,596 A | 11/1998 | Chiu | 29/830 |
| 5,844,168 A | 12/1998 | Schueller et al. | 174/52.4 |
| 5,972,736 A | * 10/1999 | Malladi et al. | |
| 5,976,916 A | * 11/1999 | Kuwamura et al. | |
| 5,998,241 A | * 12/1999 | Niwa | |
| 6,066,512 A | * 5/2000 | Hashimoto | |
| 6,248,612 B1 | * 6/2001 | Castro et al. | |
| 6,258,631 B1 | * 7/2001 | Ito et al. | |

* cited by examiner

Primary Examiner—John F. Niebling
Assistant Examiner—Josetta Jones
(74) Attorney, Agent, or Firm—Martine & Penilla, LLP

(57) ABSTRACT

A tape ball grid array (TBGA) semiconductor package having a one metal layer interconnect substrate is provided. Further provided is a method for making the TBGA package having electrical connection through the one metal layer interconnect substrate down to a ground plane. The method includes: (a) defining at least one via hole through the one metal layer interconnect substrate; (b) filling the at least one via hole of the one metal layer interconnect substrate with a first solder ball; (c) reflowing the first solder ball; (d) placing a second solder ball over the reflowed first solder ball; and (e) reflowing the second solder ball to attach the second solder ball to the reflowed first solder ball. The reflowed first solder ball and the reflowed second solder ball form a ground via connection to the ground plane of the TBGA.

24 Claims, 20 Drawing Sheets

METHODS FOR FORMING GROUND VIAS IN SEMICONDUCTOR PACKAGES

CROSS REFERENCE TO RELATED APPLICATIONS

This application claims priority under 35 U.S.C. § 120 and is a continuation-in-part of pending U.S. patent application having application Ser. No. 08/892,471, filed Jul. 14, 1997 U.S. Pat. No. 6,020,637, entitled "Ball Grid Array Semiconductor Package and Method for Making the Same," and naming Marcos Karnezos as an inventor. The contents of this pending application are hereby incorporated by reference.

BACKGROUND OF THE INVENTION

1. Field of the Invention

The present invention relates generally to the packaging of integrated circuits, and more particularly to tape ball grid array (TBGA) semiconductor device packages having ground vias, and methods for manufacturing ground vias in TBGAs.

2. Description of the Related Art

The continuous increase in performance of integrated circuits is having a proportionate increase in demand for integrated circuit packages that dissipate heat more efficiently, operate under higher clock frequencies, and produce smaller footprints while meeting increased reliability requirements. There are a number of packaging technologies that offer some of these properties, but fail to meet others. Multi-layer ceramic and deposited thin film BGAs are among some of the high performance solutions commonly available today. Unfortunately, these solutions tend to be prohibitively expensive, and therefore fail to meet the highly competitive cost structure associated with high volume packaging operations. As such, the high cost of packaging materials and package manufacturing limit their use in cost sensitive high performance products.

FIG. 1 shows a prior art "cavity down" BGA package 5 having a multi-layer printed circuit board (PCB) substrate and a metal heat spreader 10 as disclosed by R. C. Marrs et al. in U.S. Pat. No. 5,583,378. In the illustrated construction, the cavity is defined by PCB interconnect metal layers 14, 16 and 18, which are patterned over dielectric layers 24. In this example, the multiple layer PCB is formed by alternating layers of metal (i.e., 14, 16 and 18) and dielectric layers (i.e., 24), which may be a BT resin dielectric available from Mitsubishi Gas & Chemical Co. of Japan. Bonding shelves 28 are defined as part of each of the patterned metal layers 14 and 16, and are used for wire bonds 26. In this manner, wire bonds 26 may be electrically interconnected to a semiconductor die 12 that is shown attached to the heat spreader 10 with a die attach epoxy 13.

To complete the electrical interconnections between metal layers, a plurality of vias 30 may be used. In typical BGA designs that implement PCB technology (where the minimum metal trace width is about 100 microns), at least four metal layers are needed to interconnect about five rows of solder balls 20, and even more metal layers are needed when power and ground planes are required. As a result, the PCB substrate alone inevitably grows to thicknesses greater than 0.7 mm, thereby substantially increasing the cost of manufacturing the packaging arrangement. Further, thicker substrates have poor heat dissipation performance and reduced package reliability. Further yet, the multiple metal layers required to complete complex circuit routing tends to increase the number of metal traces and via interconnects. Unfortunately, an increase in trace length and density typically contributes to an increase in trace inductance as well as electrical noise associated with electrical reflections. Each of these side effects represent exemplary drawbacks of a conventional packaging arrangement.

To accommodate thicker dies 12, designers typically increase the thickness of dielectric layers, such as the dielectric layer 24 that is interposed between the heat spreader 10 and metal layer 14. Though this serves to increase the cavity depth, the increased thickness will act to degrade heat dissipation while providing no improvement in electrical performance. Further, when die 12 is encapsulated with an encapsulant 22 and subjected to high solder reflow temperatures (i.e., 220 degrees Celsius or higher), the inherently poor heat dissipation characteristics of the packaging arrangement 5 may cause the die 12 and other package layers to delaminate. Accordingly, when heat is inadequately dissipated, the packaged arrangement will be more susceptible to over heating failures.

FIG. 2 is another example of a cavity down BGA package 50 having a "flex tape interconnect substrate" 16 attached to a heat spreader 10 as disclosed by M. Karnezos in U.S. Pat. No. 5,397,921, and hereby incorporated by reference. In this example, a cavity 15 is an integral feature of the heat spreader 10, that is typically defined by an etching operation. A particular drawback of etching is that the side walls of cavity 15 may be quite uneven and sometimes produces pointy edges around the mouth of the cavity 15. These pointy edges act as stress concentration points which cause cracks in the encapsulation and in turn reduce the package reliability.

The flex tape interconnect substrate 16 is attached directly to the heat spreader 10 via an adhesive 23. In the example shown, the flex tape interconnect substrate 16 is designed such that a gold or silver plated ground ring 21, of the heat spreader 10, is left exposed around a cavity 15. The plated ground ring 21 is therefore made available for wire bonds 26" that connect to die 12. Other bonding wires 26' may typically be used for interconnecting die 12 to various signal, power and ground lines that interconnect to selected solder balls 20.

The flex tape interconnect substrate 16 also includes a first dielectric layer 25, a single metal routing layer 18' and a second dielectric 36. Typical flex tape interconnect substrates are usually custom ordered to a packaging designer's specifications from companies such as Sumitomo Metal and Mining Co. of Japan. As is well known, when complex applications demand additional signal routing to the die 12, additional solder balls 20 will be needed, thereby requiring the flex tape interconnect substrate to have more than one metal layer. Although multi-metal flex tape interconnect substrates may be designed, the overall semiconductor package cost can potentially double with each additional metal layer.

Although the semiconductor die 12 being directly attached to the cavity 15 provides a lower heat resistive path through the heat spreader compared to the package of FIG. 1, the package may suffer from delamination at the interface between the die attach epoxy 13 and the heat spreader 10. The delamination is believed to occur when cavity 15 begins to bow in response to increased temperatures produced when semiconductor die 12 is operational. In fact, because the cavity 15 bottom is only about one third the thickness of the heat spreader 10 main body, it will naturally tend to bow and differentially expand under elevated temperatures.

A number of techniques used to combat delamination include increasing the adhesion strength of the die attach epoxy 13 and encapsulation 22 to the cavity 15 surfaces. The increased adhesion is typically achieved by treating the cavity 15 surfaces with a thick metal oxide. However, applying the thick metal oxide to the cavity 15 surfaces is very expensive. In addition, the thick metal oxide is incompatible with the silver plating operations used on the one-piece heat spreader 10, thereby requiring more expensive gold plating operations.

The encapsulation compound 22 also naturally absorbs moisture that may be confined within the cavity 15. As is well known, when moisture is confined within encapsulated cavities, the confined moisture becomes expanding steam during subsequent solder reflow operations that range in temperatures up to 220 degrees Celsius. Naturally, the confined steam expands in an outward direction causing a well known "popcorn" cracking in the encapsulation 22.

As such, the cost of a typical one-piece heat spreader is particularly high due to the multiple fabrication operations needed to etch the cavity 15 to a sufficient depth, and metal oxide coatings. Furthermore, because heat spreaders are typically manufactured in strips having a number of package sites, if one package site is defective, the entire strip is oftentimes scrapped in an attempt to minimize losses.

In view of the foregoing, there is a need for a tape ball grid array (TBGA) semiconductor device package that is cost effective and easy to manufacture with existing manufacture equipment. There is also a need for a packaging method that enables the production of high yields while providing a semiconductor package that is practical for high performance applications.

SUMMARY OF THE INVENTION

Broadly speaking, the present invention provides a method for efficiently manufacturing semiconductor packages. The semiconductor packages are preferably tape ball grid arrays (TBGAs), which incorporate inventive ground via structures and methods for forming the same. The structure of the semiconductor package preferably includes a heat spreader, a separate ground plane, and a tape interconnect substrate. The via is preferably made directly through the tape interconnect substrate to the underlying ground plane. The via is then filled with a solder ball, reflowed, and then another solder ball is placed and reflowed to establish electrical integrity. In general, the TBGA package in accordance with one embodiment of the present invention also provides improved heat dissipation, lower electrical noise, and improved density. Further yet, the TBGA package of the present invention is thinner, lighter and is less expensive to manufacture compared to prior art TBGA packages. Several embodiments of the present invention are described below.

In one embodiment, a method for making a tape ball grid array semiconductor package is disclosed. The method includes providing a ground plane strip having a plurality of package sites. A first aperture is then stamped through the ground plane for each of the plurality of package sites and the ground plane strip is joined to a heat spreader strip. A one metal layer interconnect substrate is provided and a second aperture is stamped through the one metal layer interconnect substrate and at least one via hole. One of the one metal layer interconnect substrate is attached to each of the plurality of package sites on the ground plane strip. For each of the one metal layer interconnect substrates, the method further includes: (a) filling the at least one via hole of the one metal layer interconnect substrate with a first solder ball; (b) reflowing the first solder ball; (c) placing a second solder ball over the reflowed first solder ball; and (d) reflowing the second solder ball to attach the second solder ball to the reflowed first solder ball.

In another embodiment, a method for making a semiconductor package is disclosed. The method includes: (a) providing a ground plane; (b) stamping a first aperture through the ground plane; (c) joining the ground plane to a heat spreader; (d) providing a one metal layer interconnect substrate; (e) stamping a second aperture through the one metal layer interconnect substrate and at least one via hole; (f) attaching the one metal layer interconnect substrate to the ground plane. The method further includes: (i) filling the at least one via hole of the one metal layer interconnect substrate with a first solder ball; (ii) reflowing the first solder ball; (iii) placing a second solder ball over the reflowed first solder ball; and (iv) reflowing the second solder ball to attach the second solder ball to the reflowed first solder ball.

In yet another embodiment, a semiconductor package having a one metal layer interconnect substrate is disclosed. The method for making the package includes forming an electrical connection through the one metal layer interconnect substrate down to a ground plane. The method also includes: (a) defining at least one via hole through the one metal layer interconnect substrate; (b) filling the at least one via hole of the one metal layer interconnect substrate with a first solder ball; (c) reflowing the first solder ball; (d) placing a second solder ball over the reflowed first solder ball; and (e) reflowing the second solder ball to attach the second solder ball to the reflowed first solder ball. In this embodiment, the reflowed first solder ball and the reflowed second solder ball form a ground via connection to the ground plane.

The packages of the above described embodiments have several notable advantages over the prior art. These packages use cost effective one-metal flex tape interconnect substrates to achieve the high electrical performance usually achieved by more expensive multi-metal flex tape interconnect substrates. The metal layer of the interconnect substrate may be used for signal and power connections and the ground plane for all necessary ground connections by way of ground vias. This is a distinct advantage compared to the prior art package of FIG. 2 which does not have an active, current-carrying ground plane.

Accordingly, because substantially all ground connections may be made in the ground plane, there is no electrical parasitics associated with trace inductance and therefore ground noise is substantially reduced. In one embodiment, the metal traces of the interconnect substrate are preferably uniformly spaced from the ground plane with a dielectric layer, thereby enabling more control over their electrical impedance which is very desirable in high clock frequency systems. Further, the ground plane provides an electrical shield against unwanted electromagnetic radiation, thereby reducing electro-magnetic interference to and from the integrated circuit. Reducing electromagnetic interference is particularly advantageous in high frequency systems of modem electronic products where components are closely spaced apart.

The relatively thin interconnect substrate in accordance with one embodiment of the present invention enables an efficient heat flow from the ground plane, through the interconnect substrate, to the solder balls and then to the product motherboard. Accordingly, superior heat dissipation is achieved.

It should therefore be noted that the TBGA packages described above provide cost effective features of the one-metal layer flex tape interconnect substrates, unique solder ball filled ground vias, and efficient fabrication and assembly techniques of plastic packages. Advantageously, this results in a method that produces tape ball grid array packages that dissipate heat much more efficiently, can operate at higher clock frequencies, are more reliable, are thinner and lighter, and are lower cost compared to prior art ball grid array packages. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 3B-1 and 3B-2 illustrate traditional techniques for forming ground vias in semiconductor packages.

FIGS. 3B-3 through 3B-6 illustrate a sequential technique for forming a ground via in accordance with an embodiment of the present invention.

FIGS. 3C-1 through 3C-5 pictorially show a method for making ground vias in tape ball grid array (TBGA) semiconductor packages, in accordance with one embodiment of the present invention.

FIG. 4 is a cross sectional view of a ball grid array with a heat spreader and ground plane, flex tape interconnect substrate and a lid in accordance with an alternative embodiment of the present invention.

DETAILED DESCRIPTION OF THE PREFERRED EMBODIMENTS

An invention for a semiconductor package having a functional ground plane, conductive ground vias, and a heat spreading base is disclosed. The present invention also provides a method for efficient manufacturing of semiconductor packages that increase yield, provide high performance and reduce manufacturing costs. In the following description, numerous specific details are set forth in order to provide a thorough understanding of the present invention. It will be understood, however, to one skilled in the art, that the present invention may be practiced without some or all of these specific details. In other instances, well known process operations have not been described in detail, as they are well known to those skilled in the art.

I. Semiconductor Package Embodiments

Figure 3A:
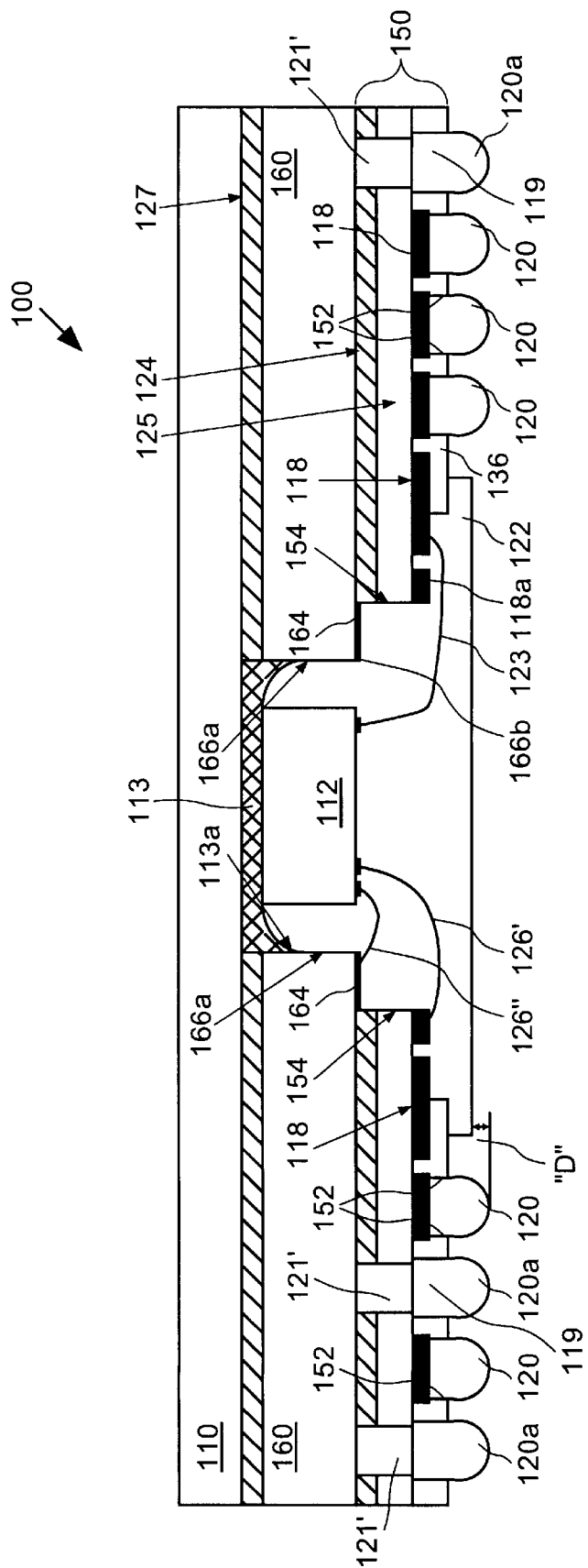
FIG. 3A is a cross sectional view of a ball grid array package having a heat spreader, a ground plane and a single metal layer flex tape interconnect substrate wire bonded to the semiconductor die in accordance with one preferred embodiment of the invention.

FIG. 3A is a cross sectional view of a wire bonded version of a tape ball grid array (TBGA) package 100 in accordance with one embodiment of the present invention. As shown, TBGA package 100 includes a heat spreader 110 having a semiconductor die 112 attached with a die attach epoxy 113 and a ground plane 160 having a flex tape interconnect substrate 150. Preferably, the ground plane 160 is attached to the heat spreader 110 by an adhesive layer 127 which is first attached to the ground plane 160 and then to the heat spreader 110. The die 112 has a first surface that is attached via the die attach adhesive 113 to the heat spreader 110 in a package cavity defined by the ground plane 160 and flex tape interconnect substrate 150. The die attach adhesive 113 can be any number of well known adhesives including a silver filled epoxy that provides excellent thermal and electrical conductivity, or any others having strong adhesion properties.

In one embodiment, the first surface of the die 112 is electrically connected to the ground plane 160 by dispensing additional silver filled die attach epoxy 113 to contact the ground plane walls 166a at a point 113a. When additional silver filled die attach epoxy 113 is used, the first surface of the semiconductor die 112 is advantageously maintained at substantially the same electrical potential as the ground plane 160. Of course, the semiconductor die 112 has a first surface that contains the electrical contacts called bond pads that enable external electrical connections.

Preferably, the flex tape interconnect substrate 150 includes an adhesive layer 124 that is used to secure a first dielectric layer 125 to the ground plane 160. As mentioned earlier, flex tape interconnect substrate 150 can be custom ordered to routing specifications from a number of companies such as Sumitomo Metal and Mining Co. of Japan. As such, a patterned metal layer 118 is routed between the first dielectric layer 125 and a second dielectric layer 136. The second dielectric layer 136 is typically a solder mask having circular apertures called pad openings 152. The pad openings are generally about 0.1 mm smaller in diameter than the diameter of the underlying ball pads patterned by the metal layer 118. Preferably, the second dielectric layer 136 has a rectangular aperture that leaves exposed a portion of the patterned metal layer 118 that defines a power ring 118a and bond fingers terminating at or near power ring 118a. The power ring 118a and bond fingers 118e will be described in greater detail with reference to FIG. 3D below.

In this embodiment, the flex tape interconnect substrate 150 is designed to have a larger rectangular aperture 154 surrounding a rectangular cavity opening 166b defined by the ground plane 160. In this manner, a ground ring 164 may be conductively plated directly onto the ground plane 160 (e.g., nickel or silver plated) to provide a ground source for the die 112. In addition, it should be appreciated that the ground plane 160 acts as a functional layer that may be used to provide a ground source to selected solder balls 120a throughout the package 100. The ground plane 160 therefore provides an active, current carrying layer for all ground connections without the need for a costly second metal layer in the flex tape interconnect substrate 150. By way of example, a ground connection may be made from any solder ball by defining a ground via 119 through the flex tape interconnect substrate 150. As will be described in greater detail below, a ground via 119 is preferably filled by placing a first solder ball into the via hole in contact with the ground plane 160, performing a first reflow, placing a second solder ball 120a over the reflowed first solder ball, and then performing another reflow to attach the second solder ball 120a to the reflowed first solder ball.

The semiconductor die 112 bond pads can be wire bonded to any one or more of the bond fingers 118e, power ring 118a, ground ring 164 or signal lines. As shown, an exemplary bond wire 123 is coupled to a signal line, an exemplary bond wire 126' is coupled to power ring 118a, and an exemplary bond wire 126" is coupled to the ground ring 164. Once the die 112 is appropriately interconnected, the cavity is filled with an encapsulation material 122 to protect the die and the wire bonds from the environment and provide suitable mechanical protection. Because some wire bonds are coupled to the top surface of the flex tape interconnect substrate 150, it is preferable that the encapsulation material 122 extends over the flex tape interconnect substrate 150 about 0.20 mm. Although any suitable encapsulation technique may be used, dam forming and encapsulation fill techniques work particularly well. For example, a dam is first formed around the outline of the encapsulation by dispensing a high viscosity version of the encapsulation material 122 and then subsequently filling the cavity with a less viscous version of the same encapsulation material 122.

The ball grid array package 100 of FIG. 3A therefore provides numerous advantages over prior art packages. By way of example, the package 100 in accordance with one embodiment of the present invention provides substantially improved heat dissipation, improved electrical performance and reliability. Furthermore, the package 100 is substantially thinner, lighter and much less expensive to manufacture that the prior art designs.

Further, the layered structure of the cavity having the pliable adhesive 127 provides for independent thermal expansion between the heat spreader 110 and the ground plane 160. As a result, a difference in temperature between the two parts results in significantly less bowing of the heat spreader 110 and therefore less stress on the semiconductor die 112 and less delamination from the cavity. Of course, less delamination always results in better package reliability.

As a further advantage, the layered structure of the package 100 enables the use of thin copper sheets for the construction of the heat spreader 110, and the ground plane 160. In addition, the flex tape interconnect substrate 150 is well suited for making a thin TBGA package that is very light weight. This is a desirable advantage in smaller new generation semiconductor devices that require a compact package and run at higher frequencies, thereby benefiting from the substantially improved heat dissipation.

The manufacturing cost is also reduced because the package is only a one-metal layer 118 flex tape interconnect substrate 150 that is formed by existing well known mechanical stamping. As mentioned earlier, the heat spreader 110 and ground plane 160 are also mechanically stamped, thereby eliminating the need for more expensive etching techniques used in the example of FIG. 2. Furthermore, the heat spreader 110 is generic to the package body size and therefore does not need special tailoring to the semiconductor die 112 size nor specific electrical connections.

Figures 1, 3B:
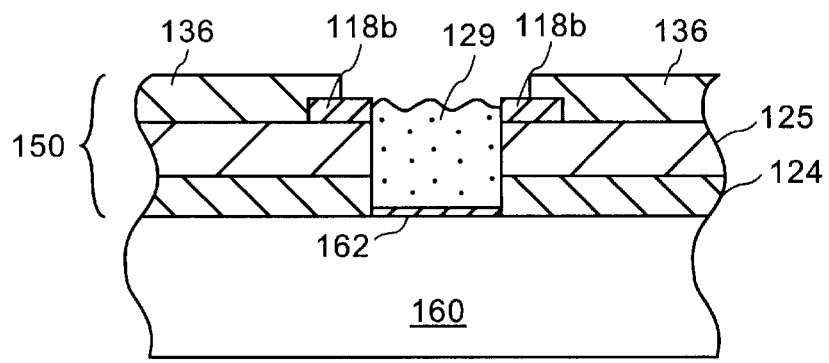
Figures 2, 3B:
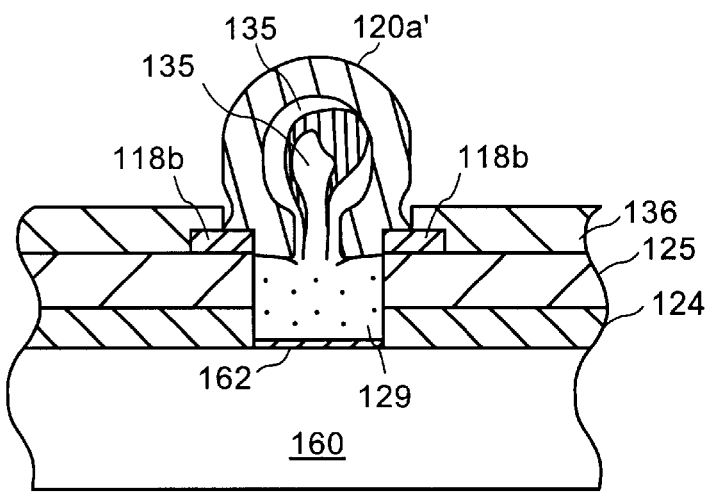
Figures 3, 3B:
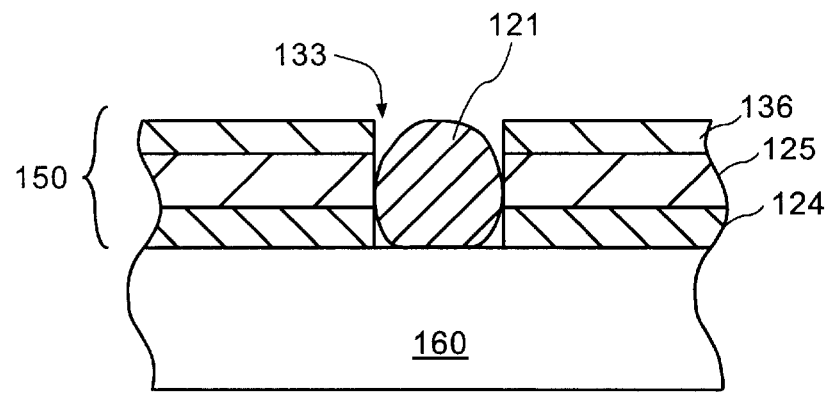

FIG. 3 B-1 illustrates a partial view of the semiconductor package of the present invention. As shown, the ground plane 160 has a flex tape interconnect substrate 150 attached thereto. The interconnect substrate 150 has an adhesive layer 124, a first dielectric layer 125 (e.g., a polyimide layer), a patterned metal layer 118, and a second dielectric layer 136 (e.g., solder mask). The patterned metal layer 118 is shown here to include solder ball pads 118b. A traditional technique for filling a via made through an interconnect substrate was to initially fill the via hole with a solder paste 129. The solder paste (e.g., typically applied as screen printed solder paste) was then reflowed before a solder ball was provided. After the solder ball 120a was placed, another reflow operation was performed in order to attach the solder ball to the reflowed solder paste.

Unfortunately, recent tests have shown that internal voids 135, which may exhibit themselves as electrical open circuits, are appearing in via structures. It is believed that either one or both of the reflow operations performed to attach the solder ball 120a and reflow operations performed to precondition a part for reliability testing is causing the internal voids 135. In general, the internal voiding may be caused by trapped air in the ground via 119 during solder paste printing and/or improper solder ball pad 118b design. Another problem recently discovered with solder paste printing is that the amount of solder paste applied to via holes was not well controlled. In cases where not enough solder paste was applied, the internal voids 135 were shown to be more severe. Also in cases where not enough solder paste was applied, there was a problem with coplanarity of assembled parts. That is, not all solder balls 120/120a are at the same level. Such manufacturing flaws can drop package assembly yield or make solder ball jointability weak at board level.

Figures 3, 3B, 4:
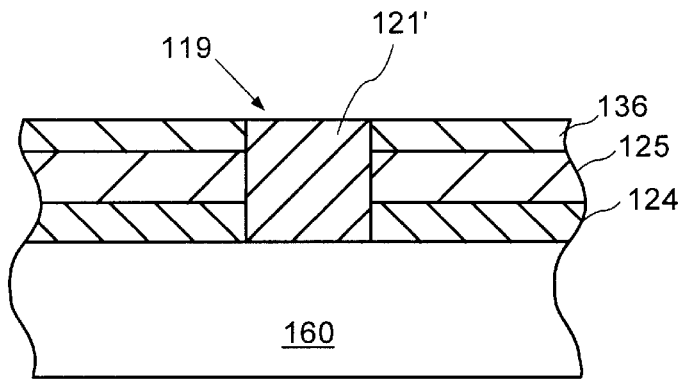
Figures 3, 3B, 4, 5:
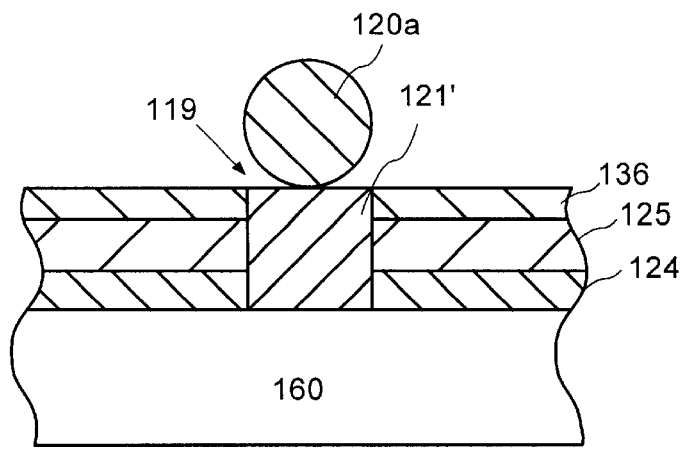
Figures 3, 3B, 4, 5, 6:
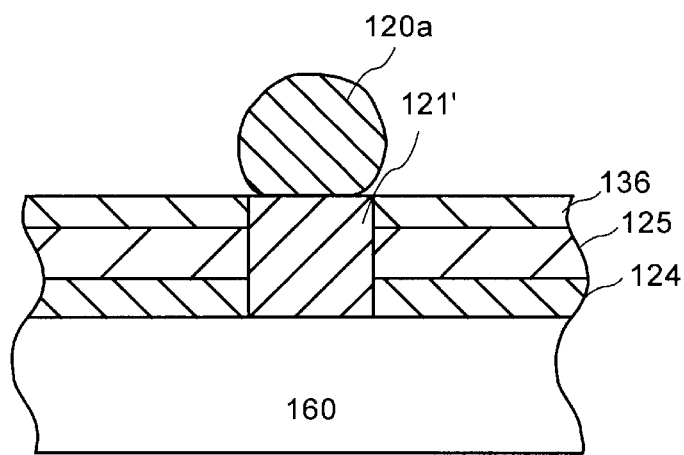

FIG. 3B-3 illustrates a cross-sectional view of the placement of a solder ball 121 into a via hole defined through the interconnect substrate 150. In this embodiment, the via hole 133 is made through the interconnect substrate 150. It should be noted that the solder ball pads 118b are no longer implemented. Once the solder ball 121 is placed in the via hole 133, a reflow operation is performed. After the reflow operation is complete, the via hole 133 will be filled with a reflowed solder ball 121' as shown in FIG. 3B-4. Now that the via hole 133 is filled, a proper ground via 119 is established. The ground via 119 will thus be in good electrical contact with the ground plane 160. Cross-sectional tests confirm that voids are no longer being formed in the ground vias 119 and solder balls 120a.

A solder ball 120a is then placed over the reflowed solder ball 121' (which established the ground via 119) as shown in FIG. 3B-5, and then another reflow operation is performed to attach the solder ball 120a as shown in FIG. 3B-6. Again, it should be appreciated that by filling the via holes 133 with a solder ball first and reflowing the solder ball to establish a ground via, the problem of internal voiding is eliminated. This makes for a substantially more reliable ground via connection as well as a more reliable semiconductor package.

Figure 1:
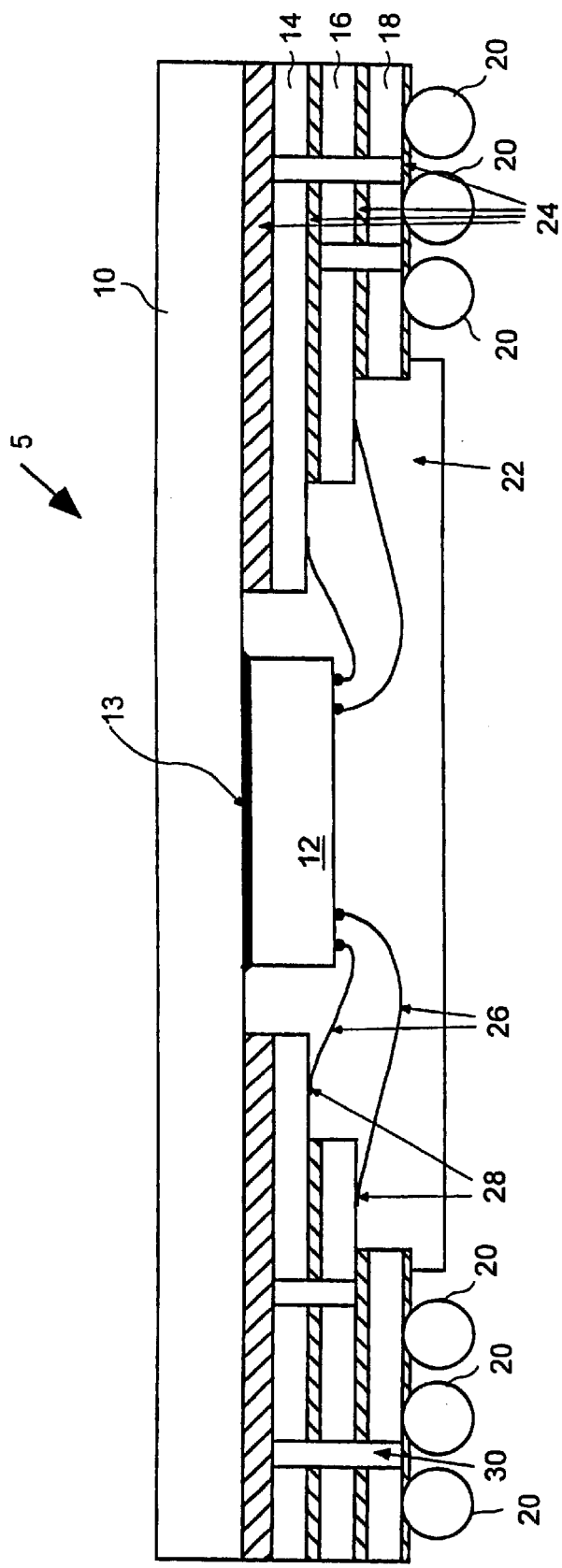
FIG. 1 is a cross-sectional view of a prior art ball grid array package having a heat spreader and multi-layer PCB interconnect substrate wire bonded to a semiconductor die.
Figure 2:
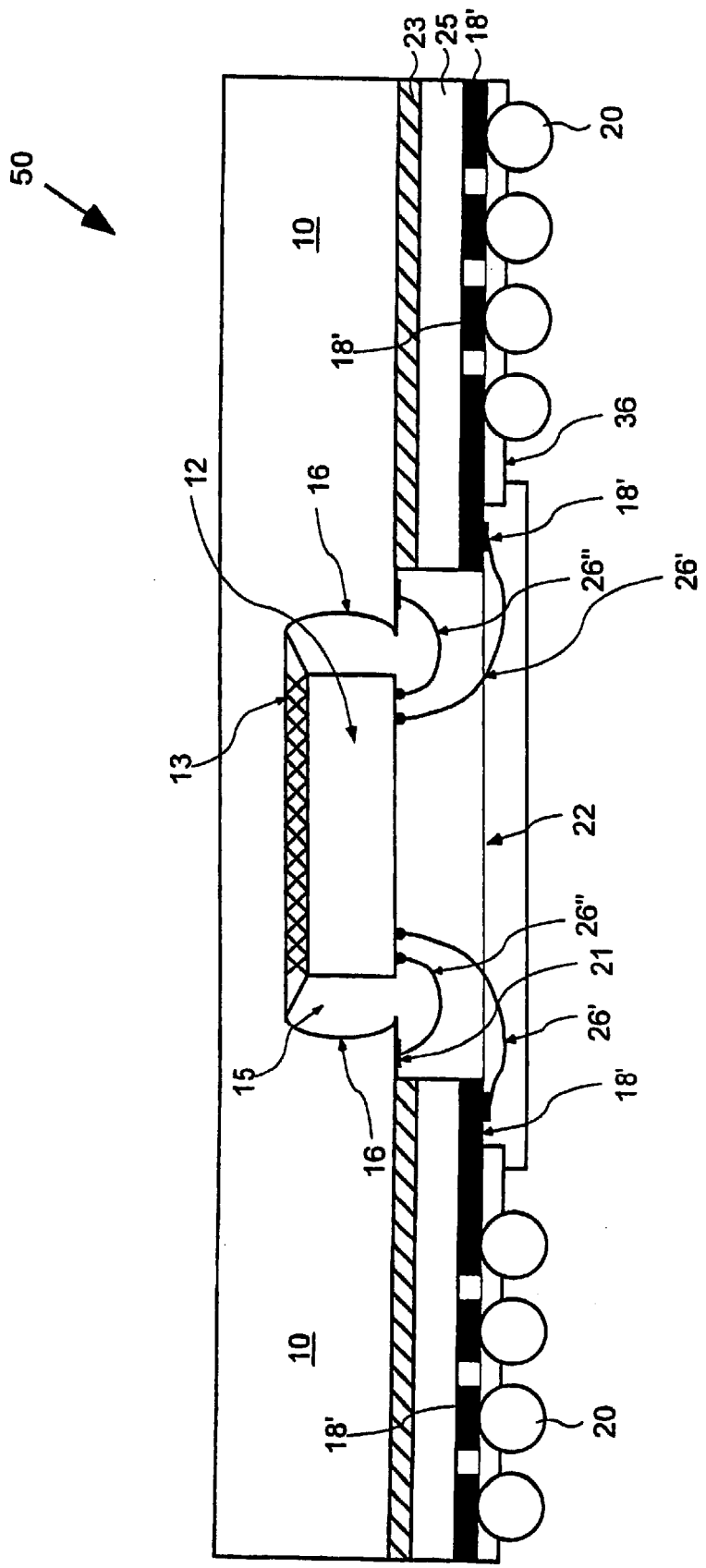
FIG. 2 is a cross sectional view of another prior art ball grid array having an etched cavity heat spreader and a metal layer flex tape interconnect substrate wire bonded to a semiconductor die.
Figures 1, 3C:
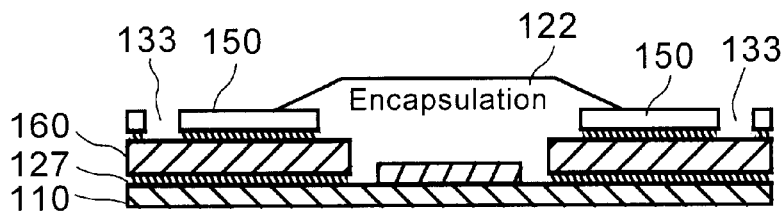
Figures 2, 3C:
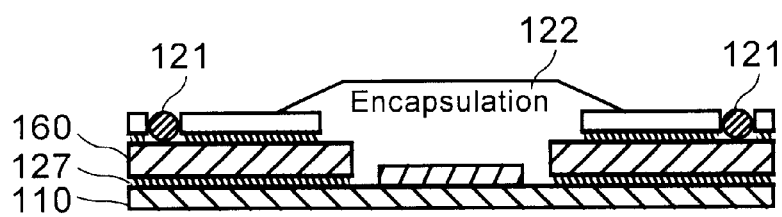
Figures 3, 3C:
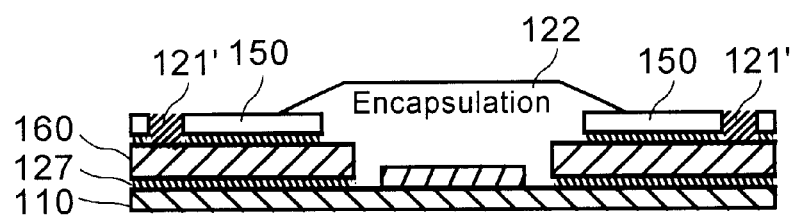
Figures 3, 3C, 4:
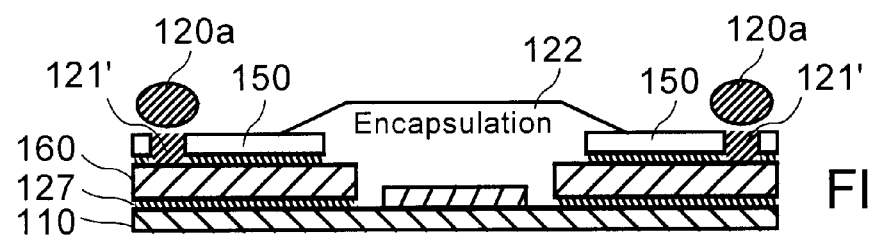
Figures 3, 3C, 4, 5:
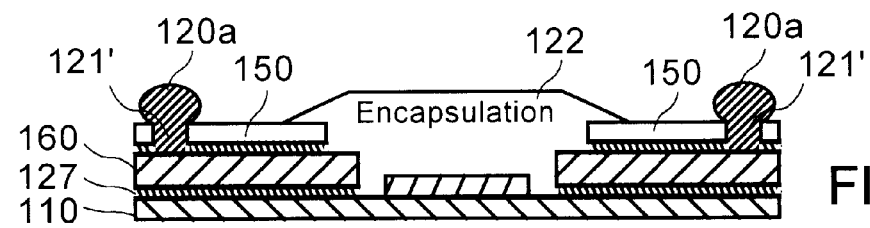

FIGS. 3C-1 through 3C-5 pictorially illustrate the process of filling the via holes 133 in a tape ball grid array (TBGA) package. Initially, the via holes 133 are defined through the interconnect substrate 150 as shown in FIG. 3C-1. In FIG. 3C-2, solder balls 121 are placed into the via holes 133. As mentioned above, the ground plane 160 is preferably plated in the locations of the via holes 133 so that a more reliable connection can be made to the ground plane 160 (the ground plane preferably made of copper). The package is then placed through a first reflow operation so that the solder balls 121 are reflowed and conformally fill the via holes 133. The reflowed solder balls 121' will therefore fill the via holes up to about the top surface of the interconnect substrate 150 as shown in FIG. 3C-3.

In FIG. 3C-4, solder balls 120a are placed over the top surfaces of the reflowed solder balls 121'. Another reflow operation is then performed so that the solder balls 120a form a proper bond to the reflowed solder balls 121'. The filled via holes 133 will then function as reliable ground vias.

Figure 3D:
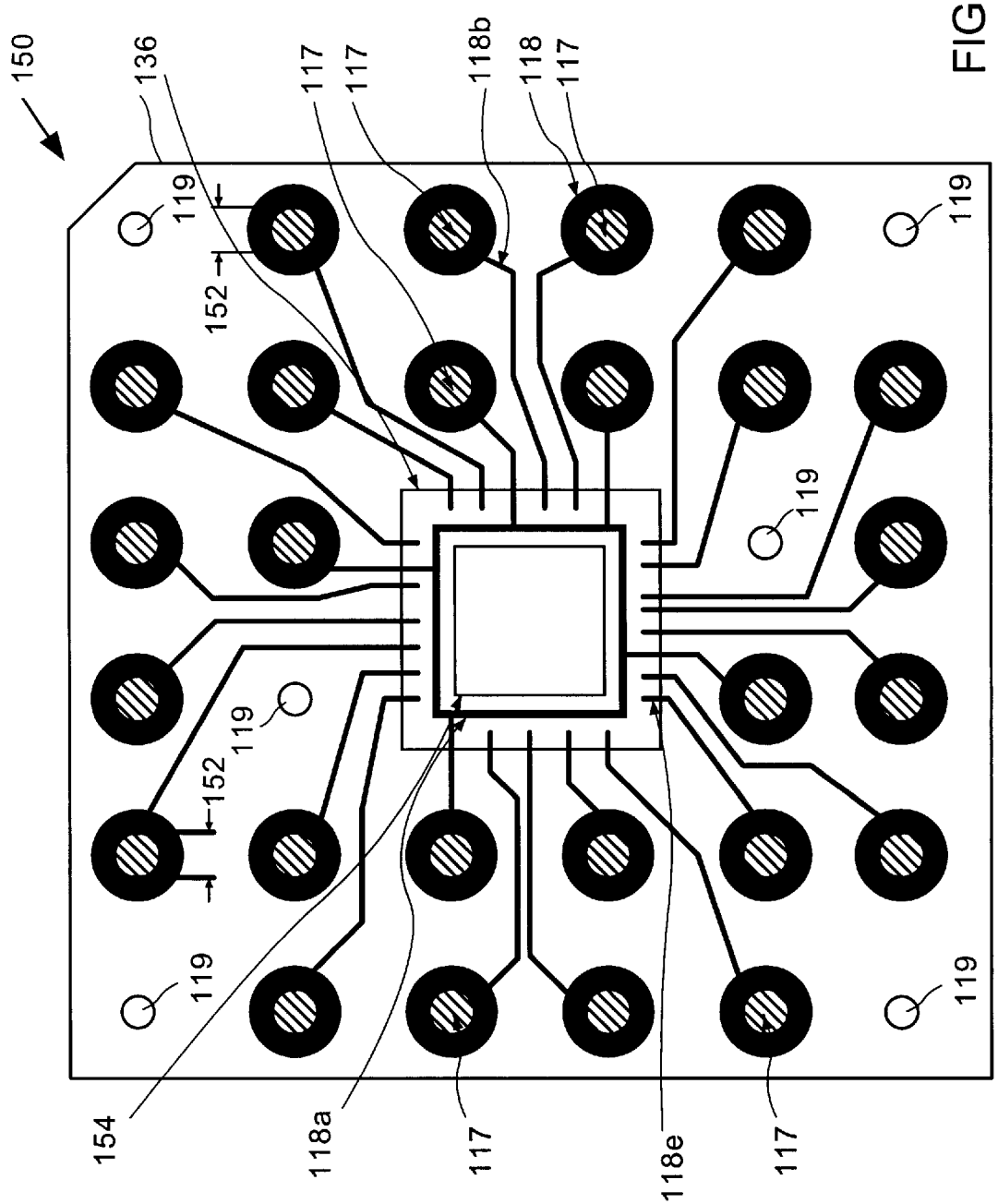
FIG. 3D is a bottom view of the flex tape interconnect substrate with one metal layer, two dielectric layers, an adhesive layer, ground vias, ball pads, power ring, bonding fingers and the device aperture in accordance with one preferred embodiment of the invention.

FIG. 3D is a bottom view of the flex tape interconnect substrate 150 in accordance with one embodiment of the present invention. This view illustrates a plurality of circular metal ball pads 117 defined through the pad openings 152 in the second dielectric layer 136. In one embodiment, the underlying metal ball pads 117 are patterned from the metal layer 118 as described above, and the pad openings 152 are about the same diameter as the solder balls 120 or slightly smaller. As mentioned above, the flex tape interconnect substrate 150 has a centrally designed rectangular aperture 154 that is preferably aligned, but larger than the rectangular cavity opening 166b defined by the ground plane 160. As such, the silver plated ground ring 164 (of FIGS. 3A and 3G) is left exposed for bond wire interconnection.

This view also shows a plurality of conductive metal traces 118b coupled to the metal ball pads 117 and ending in bond fingers 118e near the cavity periphery. Also shown is the power ring 118a that is between about 0.4 mm and 0.5 mm wide. In some cases, the metal traces 118b may be connected to the power ring 118a, and in other cases, the metal traces 118b may end short of the power ring 118a, thereby defining the bond fingers 118e. In one embodiment, all exposed portions of metal layer 118 (i.e., not covered by the second dielectric layer 136), which may include the metal ball pads 117, the power ring 118a and the bond fingers 118e are plated with nickel having a typical thickness of between about 1 micron and about 2 microns, and gold plated with a thickness of about 0.5 microns.

As described above, the underlying ground plane is used as a functional current carrying surface, and therefore, any number of ground vias 119 may be provided for subsequently formed solder balls 120a. As such, when a ground via 119 is provided through the flex tape interconnect substrate 150, no additional metal traces 118b will be required for those solder ball contacts. Accordingly, it is possible to package high performance dies 112 in package 100 without having to use expensive flex tape interconnect substrates having more than one metal.

An advantage of the present embodiment is that the routing density of the flex tape interconnect substrate 150 may be increased due to the implementation of the current carrying ground plane 160. For example, the flex tape interconnect substrate 150 may be designed to the highest density levels at the corners of the package, where more solder balls 120 from the outer rows have to be routed to the central area. This density generally determines the number of solder balls 120 that may be fully routed on each metal layer 118. Therefore, by using about 38 micron wide metal traces 118b, up to about five rows of solder balls 120 having about 1.27 mm pitch can be routed in one metal layer 118. For comparison purposes, the ground connections in conventional BGA packages to a typical die take up to about 15% or more of the total solder ball count. However, designs in accordance with the present invention make all the ground connections between the die 112 and the solder balls 120a through the ground plane 160. Therefore, if a fraction of the corner area solder balls 120a are allocated for ground connections, then a sixth inner row may be routed to increase the solder ball 120 count of the package 100. In this manner, signal routing may be increased without increasing the package size.

Figure 3E:
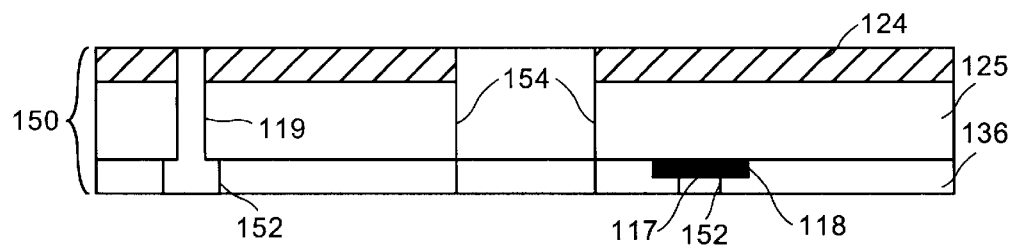
FIG. 3E is a cross sectional view of the flex tape interconnect substrate with the first adhesive, one metal layer and two dielectric layers in accordance with one preferred embodiment of the invention.

FIG. 3E is a magnified cross sectional view of a flex tape interconnect substrate 150 in accordance with one embodiment of the present invention. This magnified view, shows the adhesive layer 124 attached to one side of the first dielectric layer 125. In one embodiment, the adhesive layer 124 has a thickness of about 50 microns, and is laminated onto the first dielectric layer 125. The first dielectric layer 125 is preferably a polyimide material having a thickness of about 75 microns, and is attached to the patterned metal layer 118. The metal layer 118 will preferably have a thickness of about 20 microns, plus an additional thickness of at least about 2 microns and about 0.5 microns for nickel and gold, respectively. As mentioned earlier, the patterned metal layer 118 is selectively covered with the second dielectric layer 136 that is typically a solder mask having a thickness of about 25 microns.

FIG. 3E also provides a clear cross sectional view of a ground via 119 that can be used to interconnect down to a current carrying ground plane 160 (of FIG. 3A). As mentioned earlier, pad openings 152 are defined in the second dielectric layer 136 to define a path down to the metal ball pads 117 of the patterned metal layer 118 and vias 119. However, no metal pad 118 is used for the vias 119. It is particularly important to understand that the via holes, and the rectangular aperture 154 defined in the flex tape interconnect substrate 150 are swiftly punched through all at one time by a mechanical punch.

Figure 3F:
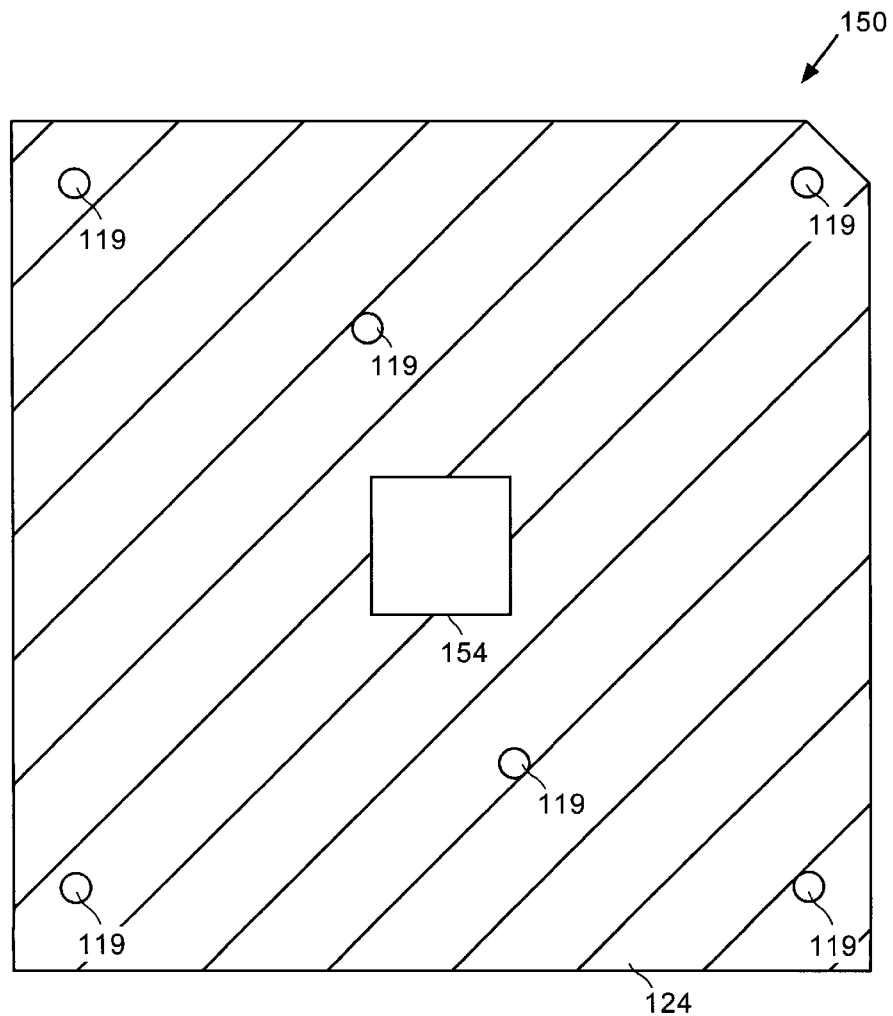
FIG. 3F is a top view of the flex tape interconnect substrate with the tape adhesive, ground vias and a device aperture in accordance with one preferred embodiment of the invention.

FIG. 3F illustrates the flex tape interconnect substrate 150 viewed from the adhesive layer 124 side after being punched through with a mechanical punch in accordance with one embodiment of the present invention. As mentioned above, the adhesive layer 124 is used to attach the flex tape interconnect substrate 150 to the ground plane 160. Preferably, the adhesive layer 124 is a temperature sensitive adhesive that may be obtained from Toray International, Inc. of Chiba, Japan. In this embodiment, a plurality of ground via holes may be defined to have a diameter that is about 0.1 mm less than the pad openings 152. The rectangular aperture 154 is preferably aligned with, and is about 1 mm larger than the cavity opening 166a defined in the flex tape interconnect substrate 150.

Figure 3G:
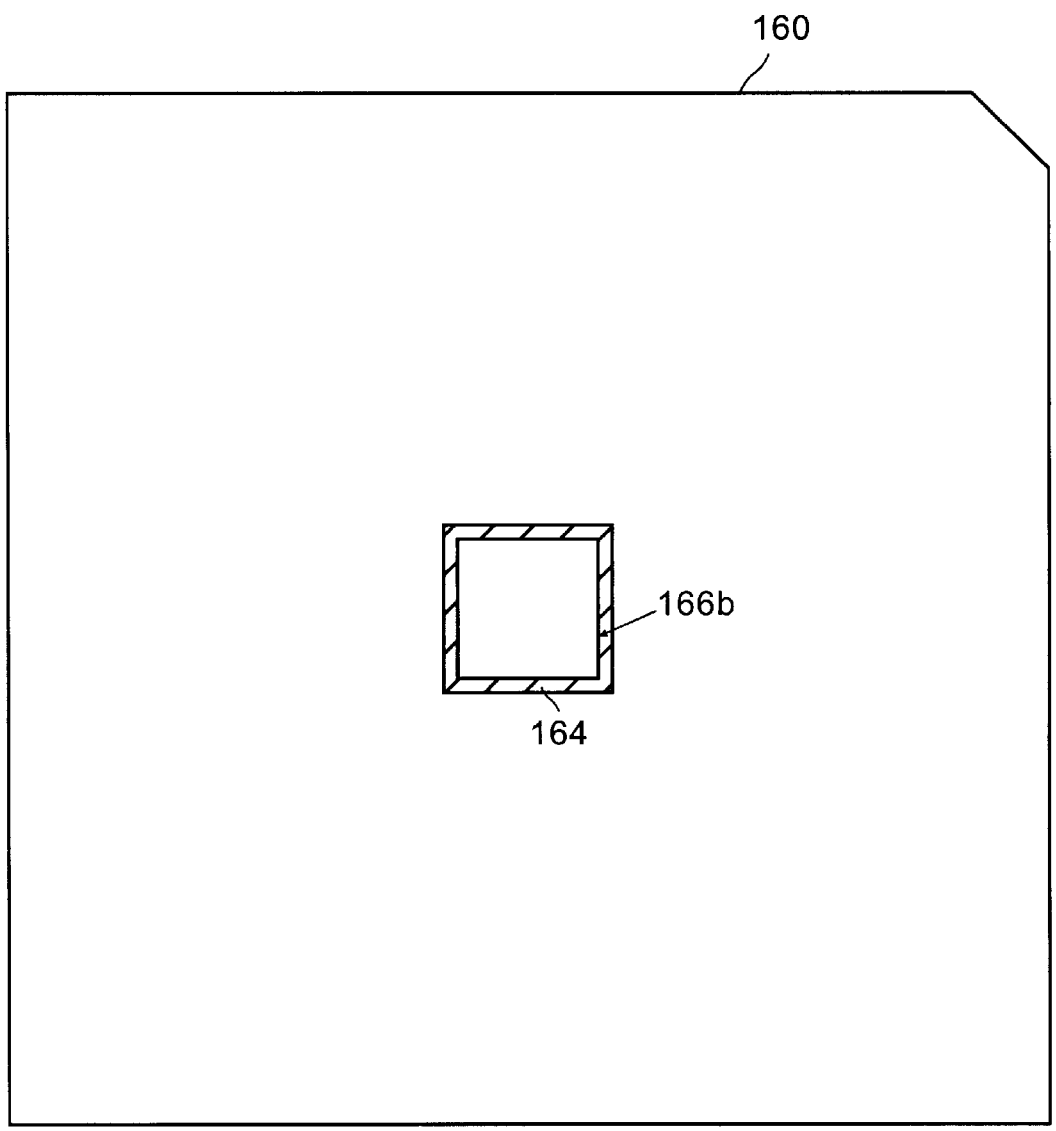
FIG. 3G is a view of the second surface of the ground plane having a silver plated pads and a device aperture in accordance with one preferred embodiment of the invention.

FIG. 3G is a view of the ground plane 160 that is configured to be attached to the adhesive layer 124 of the flex tape interconnect substrate 150 in accordance with one embodiment of the present invention. This view of the ground plane 160 also shows the silver or nickel plated ground ring 164 around a definition of the rectangular cavity opening 166b. Although the entire rectangle defined by the rectangular cavity opening 166b may be plated, because mask plating is used, it is possible to precision plate only those surface areas that benefit from the silver plating. Accordingly, the silver plated ground ring is preferably about 0.50 mm wide, and has a preferred minimum thickness of about 1 micron.

Figure 3H:
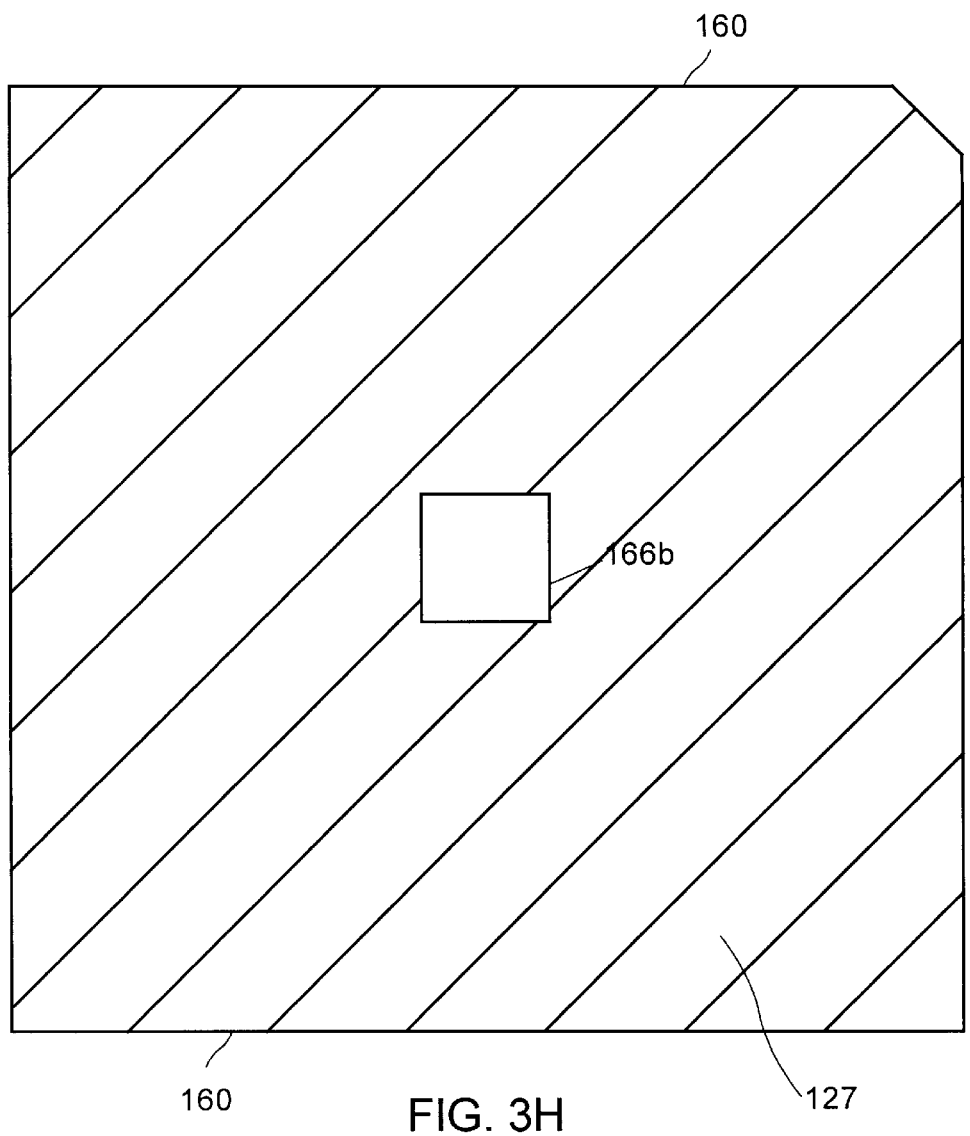
FIG. 3H is a top view of the ground plane with an adhesive layer and a device aperture in accordance with one preferred embodiment of the invention.

FIG. 3H illustrates the ground plane 160 viewed from the adhesive layer 127 that is attached to ground plane 160 in accordance with one embodiment of the present invention. Preferably, the adhesive layer 127 is a double sided adhesive that is first adhered to the ground plane 160 and then subsequently adhered to the heat spreader 110. In this manner, the ground plane 160 is adequately laminated to the heat spreader 110 as shown in FIG. 3A. In one embodiment, the adhesive layer 127 preferably has a thickness of about 50 microns, and can be one of many adhesives established in the industry including pressure sensitive adhesives, epoxies or b-stage epoxies. A temperature sensitive type adhesive that is at a heated temperature is a preferred adhesive to ensure good adhesion with ground plane. The ground plane 160 shows the cavity opening 166b in a central location, and is usually about 1.0 mm larger than the semiconductor die 112.

Figure 3I:
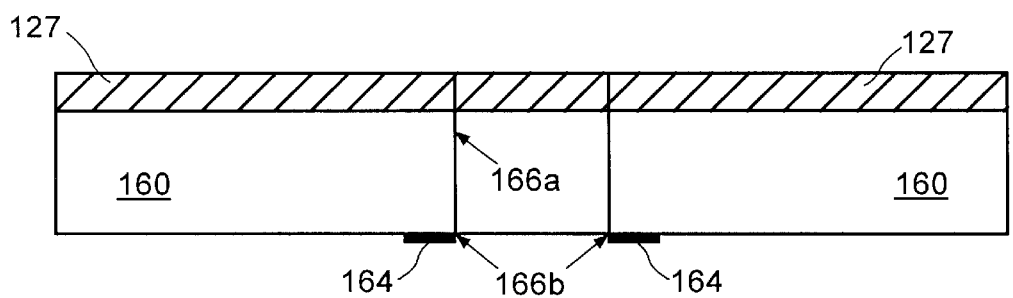
FIG. 3I is a cross sectional view of the ground plane having an adhesive layer, silver plated pads and a device aperture in accordance with one preferred embodiment of the invention.

FIG. 3I is a cross sectional view of the ground plane 160 having a centrally located cavity opening 166b that is preferably stamped-out along with the adhesive layer 127 in accordance with one embodiment of the present invention. The ground plane 160 is preferably a copper sheet having a thickness of about 0.45 mm for TBGA packages being about 1.4 mm in thickness. For TBGA packages having a thickness of about 1.0 mm or thinner, the ground plane 160 is preferably about 0.2 mm thick. In a preferred embodiment, the ground plane surface 160 covered with the adhesive layer 127 is preferably a copper oxide surface or nickel plated surface that is well suited to promote adhesion and reduce delamination from the bottom of the cavity. This view also shows the ground ring 164 that is defined around the cavity opening 166b.

As mentioned above, the ground plane 160 provides a current carrying plane for all ground connections, while the metal layer 118 of the flex tape interconnect substrate 150 is used for all the signal and power connections. As such, the ground plane 160 advantageously replaces the need for a second metal layer on the flex tape interconnect substrate 150. A significant advantage is that higher performance semiconductor dies 112 may be packaged in TBGA package 100 at substantially lower packaging costs than other packages implementing expensive multi-metal interconnect substrates.

Further yet, the ground plane 160 provides an electrical shield against unwanted electro-magnetic radiation to and from the semiconductor die 112. This is particularly important in high frequency electronic devices having close spacings between components, as well as telecommunication products having strict emissions regulations. As such, the layered structure of the formed cavity provides a good mechanical locking surface for the encapsulation compound, thus reducing delamination from the walls 166a.

Figure 3J:
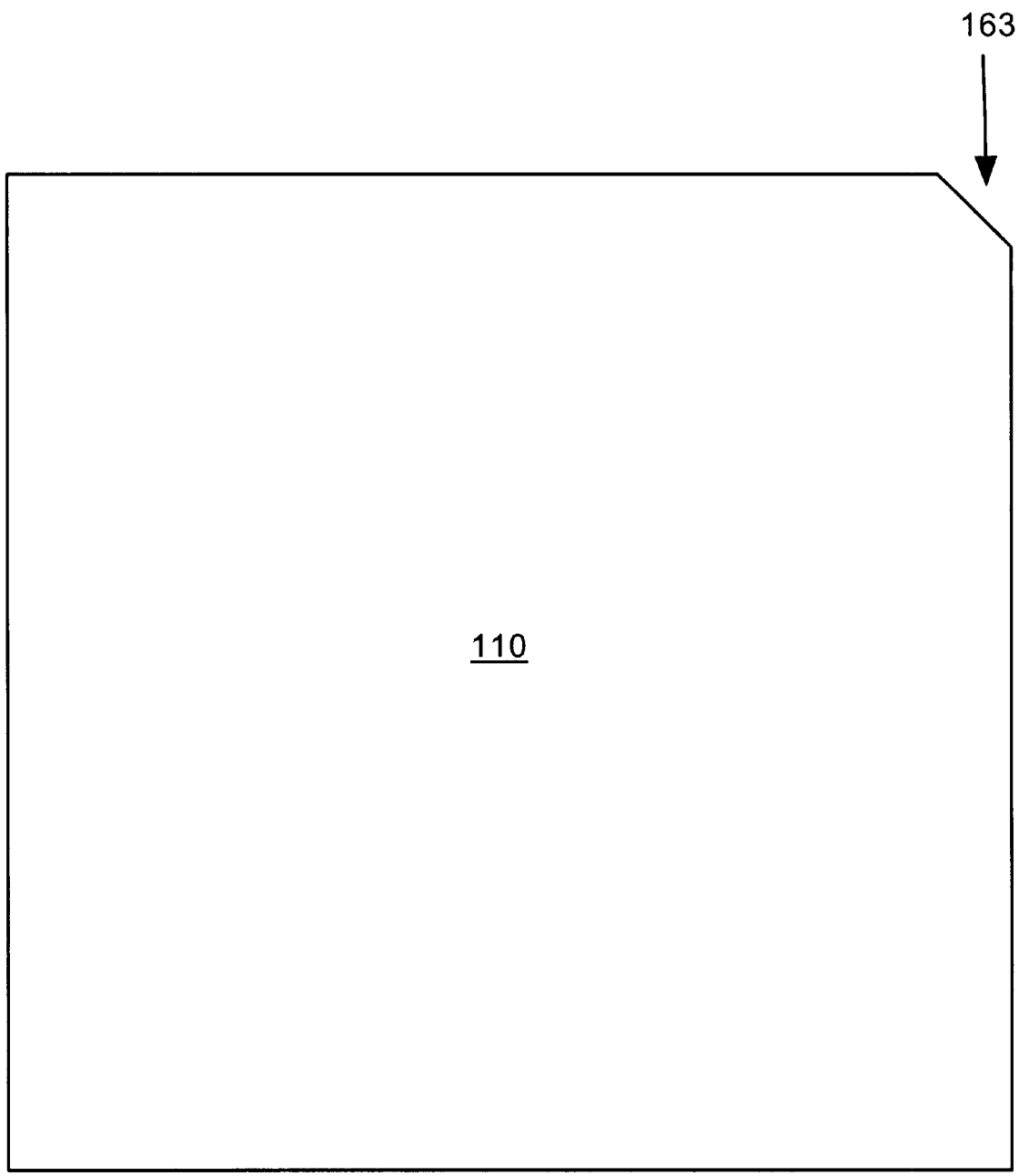
FIG. 3J is a top view of a heat spreader plate in accordance with one preferred embodiment of the invention.
Figure 4:
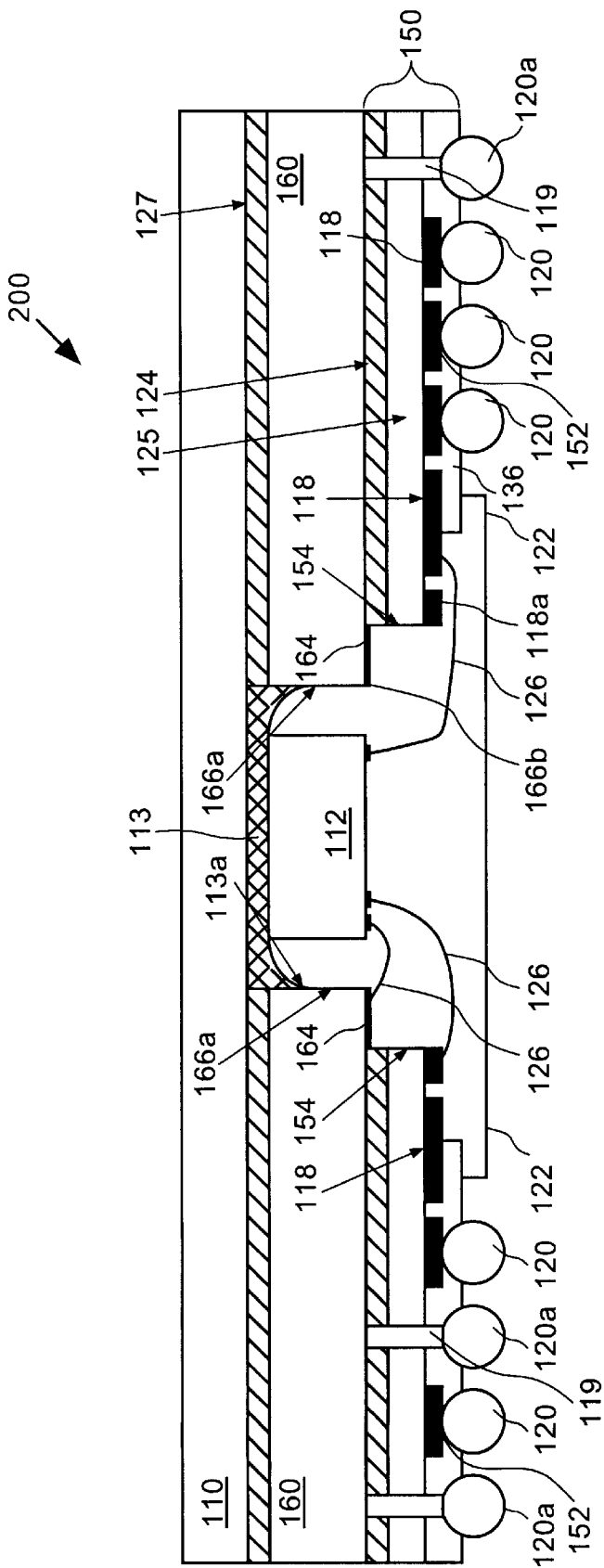

FIG. 3J is the top view of the heat spreader 110 having a chamfer 163 at the upper right corner to indicate the location of the number one solder ball 120. The heat spreader 110 is preferably a copper sheet having a thickness of between about 0.15 mm and about 0.80 mm, and is configured to cover the entire top surface of the package 100. For a 1.4 mm thick tape ball grid array "TBGA" package, the heat spreader 110 thickness is preferably about 0.25 mm, and for a 1.0 mm thick TBGA package, the heat spreader 110 has a thickness of about 0.15 mm. In one embodiment, the heat spreader 110 material is preferably a 99.9% pure hard copper (Cu) such as cop Olin copper 151 made by Olin Brass Co. of Rochester Hills, Mich. The hard copper material is preferred because it provides good planarity for the package 100.

Both surfaces can be treated to include between about 1 micron and about 7 microns of black copper oxide to improve the adhesion to both the die attach adhesive 113 and the adhesive layer 127. Alternatively, either surface can be plated with metals such as nickel to provide an electrically conductive surface. The design and construction of the heat spreader 110 can be generic to the package body size and can be substantially the same for the alternative embodiments of the present invention. It is further noted that the heat spreader 110 can be made out of other thermal conductors that have a thermal expansion coefficient closer to that of silicon at 3 ppm/C, including a copper/tungsten/copper laminate, a copper/molybdenum/copper laminate or aluminum nitride.

In one embodiment, heat spreader 110 of the present invention accounts for about 50% of the heat transferred from the semiconductor die 112 to the ambient air. The remaining about 50% is thus conducted through a second path including the adhesive layer 127, the thermally conductive ground plane 160 and the flex tape interconnect substrate 150. From the flex tape interconnect substrate 150, the heat is then transferred to the solder balls which are in contact with a mother board (not shown) onto which the package 100 is attached. The thermal conductivity of the second path includes about 125 microns of dielectric layers including adhesive layer 127, adhesive layer 124 and first dielectric layer 125, and about 450 microns of copper associated with the ground plane 160. Because there is a higher percentage metal (ie., ground plane 160) within this second path, the heat is allowed to more efficiently be transferred to the motherboard.

In contrast, the prior art BGA shown in FIG. 1 has a 0.7 mm thick PCB interconnect substrate with no significant metal content, thereby providing an inefficient thermal path. For comparison purposes, the thermal resistance of a 27 mm×27 mm TBGA package 100 according to one embodiment of this invention was measured to be about 18 C/Watt, while the thermal resistance of a similarly size PCB package was about 23 C/Watt. As will be appreciated by those skilled in the art, the improved heat dissipation of the present invention is a significant advancement in the packaging arts.

FIG. 4 is a cross sectional view of a tape ball grid array (TBGA) 200 according to a second embodiment of the present invention. In this embodiment, a lid 222 is used to cover the die 112 and bond wires 126. The lid 222 can be attached to the substrate with any number of well known adhesives, thereby leaving an empty cavity (i.e., with no encapsulation material). This construction provides sufficient expansion space in case vaporized moisture is produced within the cavity during the aforementioned reflow temperatures that reach about 220C. As an advantage, the lid 222 is well suited to prevent the possibility of die 112 delamination from the die attach epoxy 113, and of course reduce the possibility of the "pop-corning" effect most prevalent in encapsulation materials. In one embodiment, the lid can be made out of an oxidized copper sheet having a thickness of about 0.20 mm, such that sufficient mechanical strength is provided to prevent bond wires 126 from shorting with the lid 222.

As mentioned earlier, the solder balls 120 and 120a are generally attached to the flex tape interconnect substrate 150 via well known reflow techniques and have a preferred composition of about 63% tin and about 37% lead. As described with reference to FIG. 3A above, solder balls 120a are preferably in electrical contact with the ground plane 160 through solder ball filled ground vias 119.

Figure 5A:
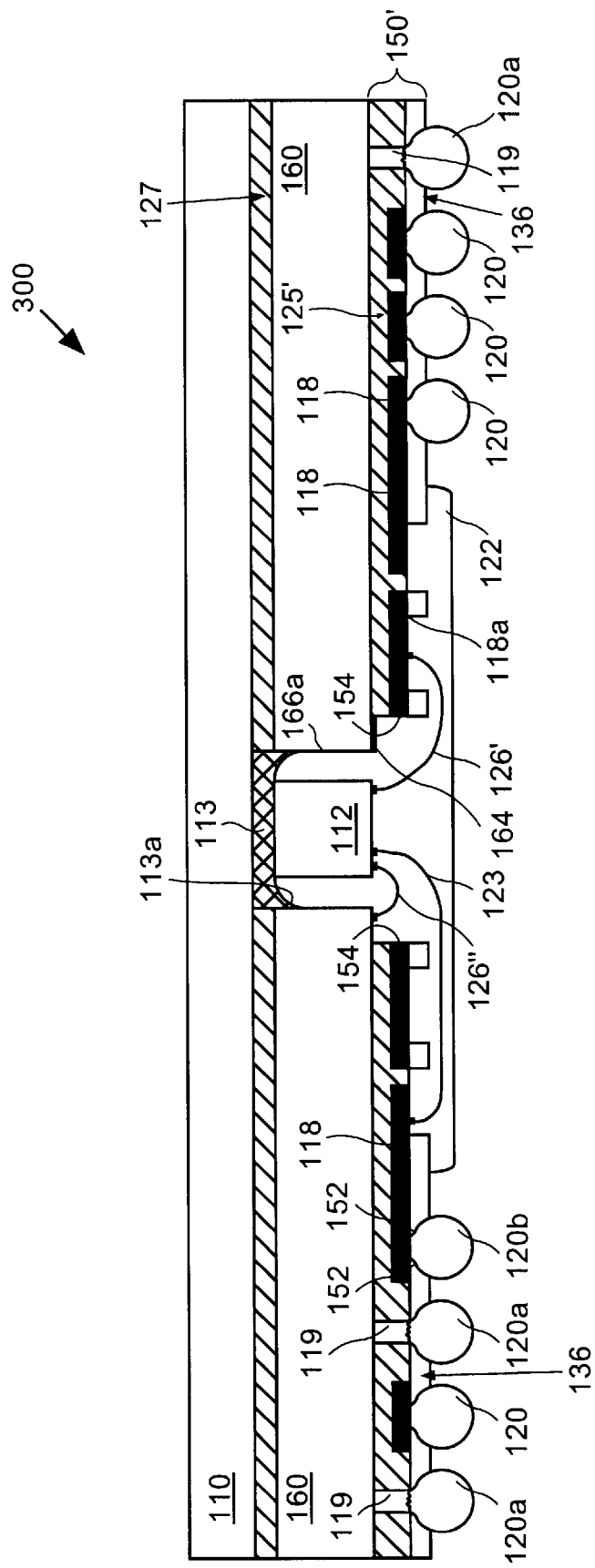
FIG. 5A is a cross sectional view of a ball grid array package with a heat spreader and ground plane using a flex tape interconnect substrate with one metal, one dielectric and one dielectric/adhesive layer in accordance with an alternative embodiment of the present invention.

FIG. 5A is a cross section of a third embodiment of the present invention using a flex tape interconnect substrate 150' having one metal layer 118, a first dielectric layer 125' and second dielectric layer 136. In this embodiment, the first dielectric layer 125' is preferably an adhesive that is used to attached to the ground plane 160 to the flex tape interconnect substrate 150'. Apart from the flex tape interconnect substrate 150', the ball grid array TBGA package 300 of this embodiment is substantially the same as the previous embodiments. Further, TBGA package 300 has substantially the same advantages over the prior art packages as the previous embodiments of this invention. However, it is noted that this flex tape interconnect substrate 150' is slightly less expensive that the flex tape interconnect substrate 150' of FIG. 3D.

Figure 5B:
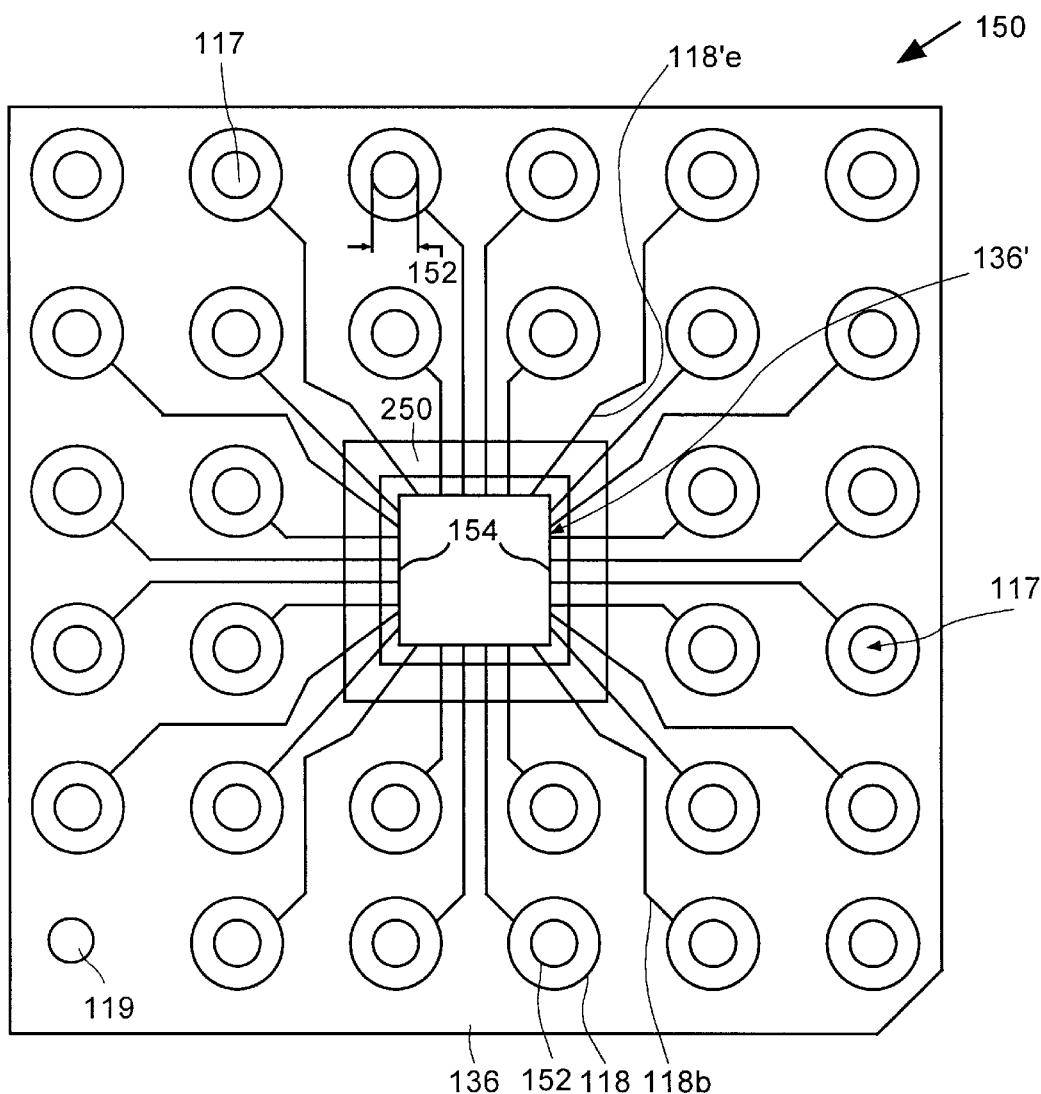
FIG. 5B is a top view of the flex tape interconnect substrate with one metal, one dielectric layer, ground ball apertures, bond finger aperture and the device aperture in accordance with an alternative embodiment of the present invention.

FIG. 5B is a top view of the flex tape interconnect substrate 150' having a metal layer 118 in accordance with the third embodiment of the present invention. The ball pads 117 are shown connected to a plurality of bond fingers 118e' of the metal layer 118. The dimensions of ball pads 117 defined in pad openings 152, the rectangular aperture 154 and ground ball pad vias are substantially the same as those described with reference to FIGS. 3A through 3J. No ball pads 117 are used for the ground vias 119. The metal layer is similarly plated with nickel/gold with a minimum thickness of about 2 microns and about 0.5 microns, respectively.

The bonding fingers 118e' on the flex tape interconnect substrate 150' are supported by the first dielectric layer 125' as shown in FIG. 5A. However, caution should be exercised to ensure that during the application of this first dielectric layer 125', the adhesiveness of this dielectric layer does not contaminate the gold plated bonding fingers 118e' such that good and reliable wire bonding is maintained. Also shown is a moat aperture 250 defining a path down to bonding fingers 118e'. As such, a second dielectric keeper ring 136' is defined around the moat aperture 250.

Figure 5C:
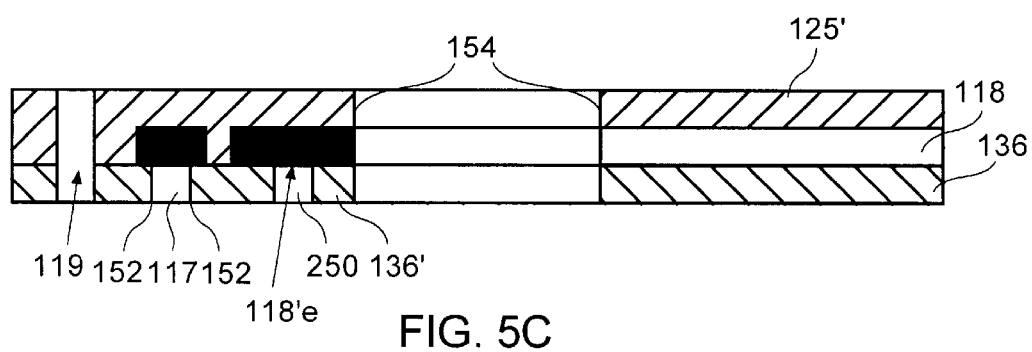
FIG. 5C is a cross sectional view of the flex tape interconnect substrate of FIGS. 5A and 5B in accordance with an alternative embodiment of the present invention.

FIG. 5C is a cross section of the flex tape interconnect substrate 150' in accordance with one embodiment of the present invention. The first dielectric 125' completely covers the metal layer 118 and forms a surface of the flex tape interconnect substrate 150'. The second dielectric layer 136 is usually a polyimide having a preferred thickness of about 50 microns. As shown, the second dielectric layer 136 may have a number of circular apertures that expose the ball pads 117 on the metal layer 118 and the aforementioned bonding fingers 118e' that are exposed through the moat aperture 250.

The flex tape interconnect substrate 150' has circular apertures 152 that are substantially the same diameter as the ball pad apertures 152 on the dielectric layer 136. The flex tape interconnect substrate 150' preferably includes a rectangular aperture 154 that is concentric to the device aperture 166b of the ground plane 160, but larger by about 1.0 mm. Of course, the flex tape interconnect substrate 150' can include more than one layer pairs of metal 118 and dielectrics for routing additional power and ground planes through solder balls 120.

Figure 6A:
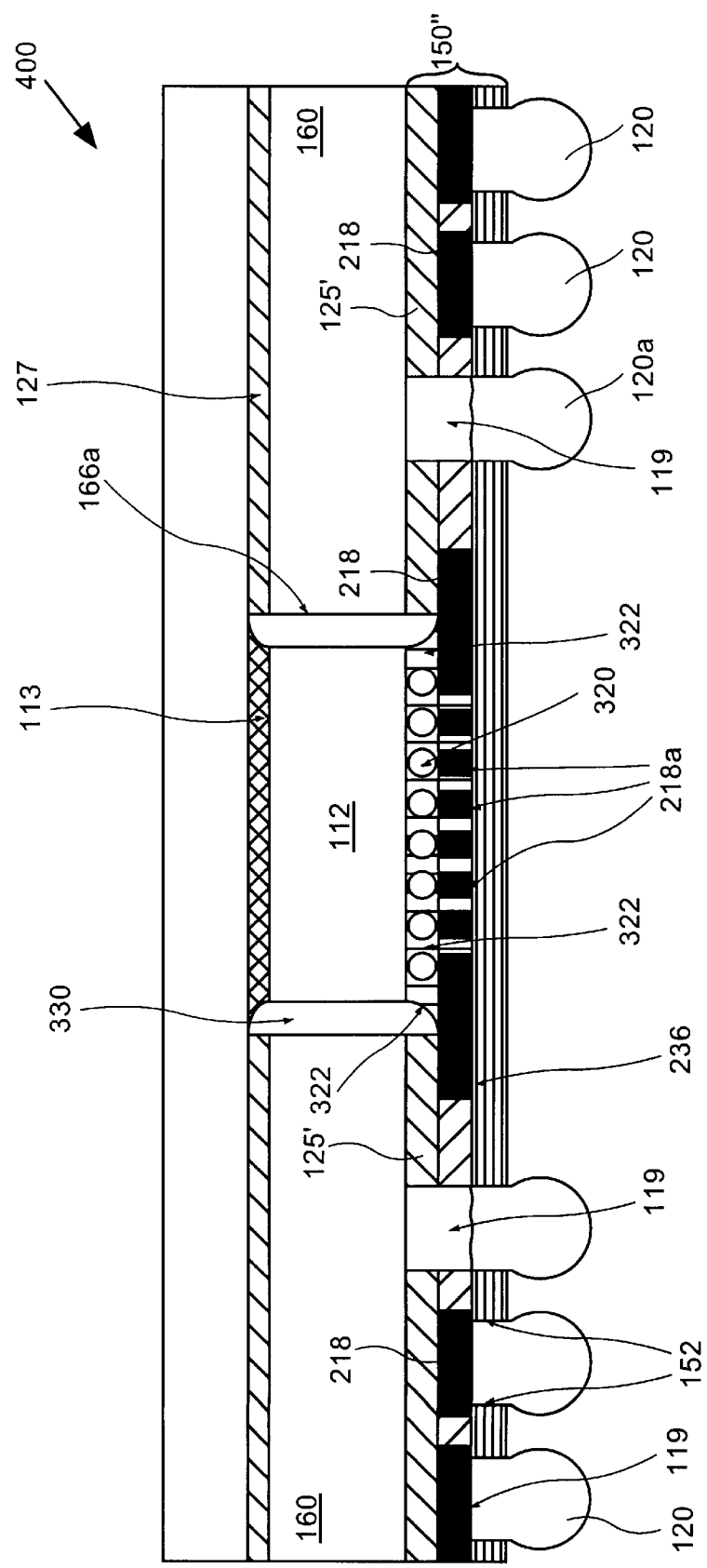
FIG. 6A is a cross sectional view of a ball grid array package with heat spreader and ground plane, flex tape interconnect substrate connected to the semiconductor die with solder bumps in accordance with an alternative embodiment of the present invention.

FIG. 6A shows a cross section of a TBGA package 400 in accordance with a fourth embodiment of the present invention where the semiconductor die 112 is connected to the flex tape interconnect substrate 150" via solder bumps 320. As in the embodiment of FIG. 5A, the first dielectric layer 125' is an adhesive layer that is well suited to attach the flex tape interconnect substrate 150" to the ground plane 160. The solder bumps 320 are reflowed onto bump pads 218a of the metal layer 218 to form an electrical and metallurgical bond to the metal layer 218. The space between the flex tape interconnect substrate 150" and the die 112 is preferably filled with an underfill epoxy 322 in order to protect the interconnect surface of the die 112 and solder bumps 320, and to provide good mechanical strength. However, one particularly advantageous feature of this embodiment is the use of a one metal layer 118 flex tape interconnect substrate 150" to connect the solder bumps 320 to the bump pads 218a.

Figure 6B:
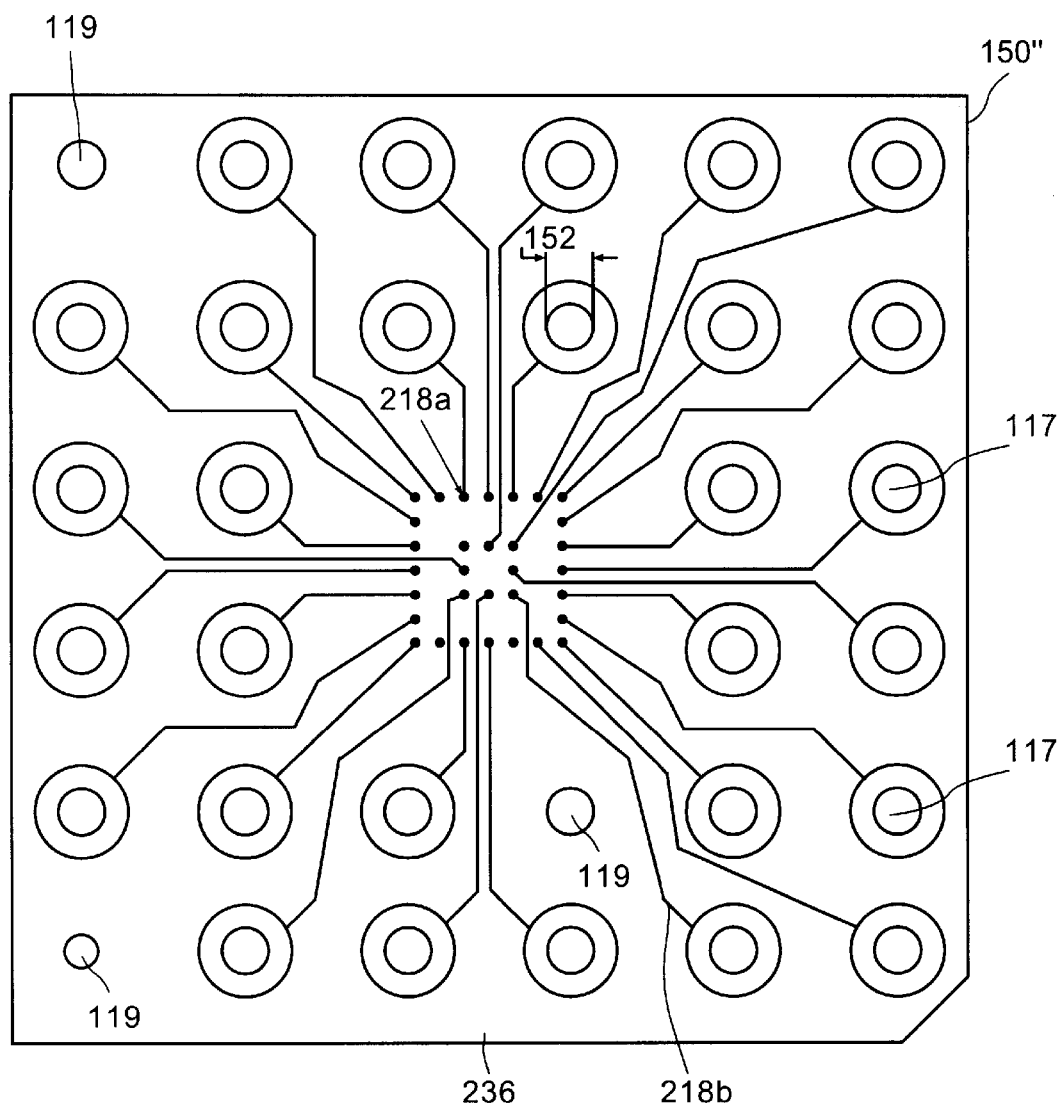
FIG. 6B is the top view of the flex tape interconnect substrate with one metal, one dielectric layer and bump pads for flip chip attachment to a semiconductor die in accordance with an alternative embodiment of the present invention.

FIG. 6B is a top view of the flex tape interconnect substrate 150" having metal layer 118 routed between circular metal ball pads 117 via a number of metal traces 218b. The bump pads 218a in the central area are preferably plated with nickel and gold as in the previous embodiments. An important advantage of this embodiment is the use of a one-metal layer flex tape interconnect substrate 150" to interconnect to the solder bumps 320 on the die 112. The ball grid array in accordance with this embodiment may be assembled in a strip form using equipment and tools well established in the assembly industry of the plastic ball grid arrays.

Figure 6C:
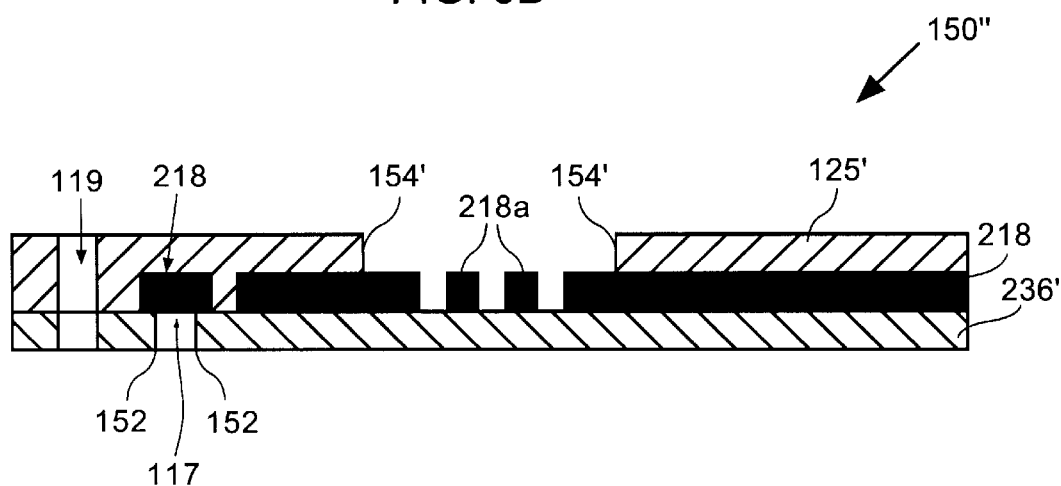
FIG. 6C is a cross sectional view of flex tape interconnect substrate of FIGS. 6A and 6B in accordance with an alternative embodiment of the present invention.

FIG. 6C shows a cross sectional view of the layer flex tape interconnect substrate 150" having one metal layer 218 in accordance with one embodiment of the present invention. As mentioned above, the first dielectric layer 125' is preferably an adhesive that is well suited to adhere to the ground plane 160. This cross section also shows a second dielectric 236' (e.g., a solder mask) that is direct contact with the underlying metal layer 218. Preferably, the first dielectric has a device aperture 154' exposing the bump pads 218*a* of the metal layer 218. Further, the second dielectric layer 236 has a plurality of openings 154 and ground vias 119 as in the previous embodiments. It is again pointed out that ground vias 119 (once filled with a solder ball and reflowed) provide the electrical interconnection to the ground plane 160 via solder balls 120*a*. In this embodiment, the bump pads 218*a* are plated with nickel and/or gold to provide a wetable surface onto which solder adheres well.

II. Methods for Manufacturing the Semiconductor Package Embodiments

Figure 7A:
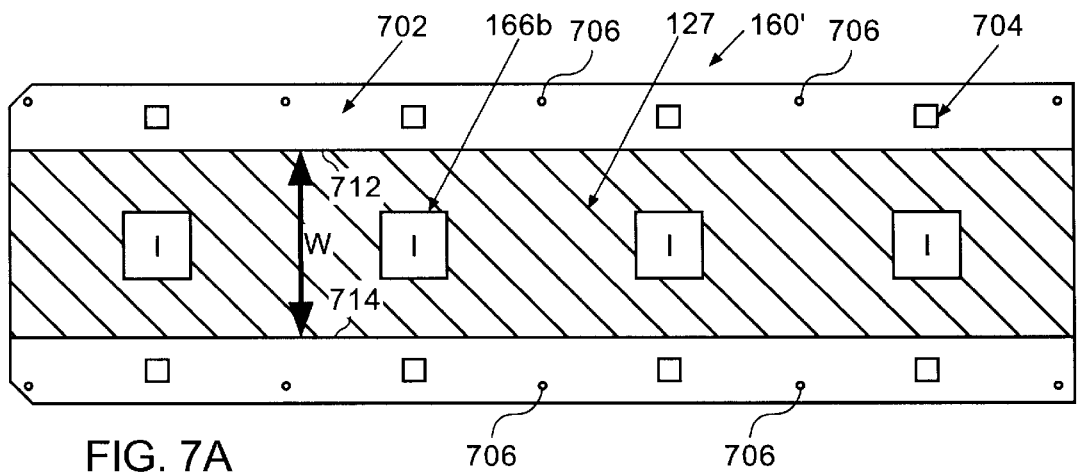
FIG. 7A is a top view of a ground plane strip having the first adhesive used in the assembly process of a ball grid array package in accordance with one embodiment of the present invention.

FIG. 7A shows a top view of a ground plane strip 160' from the adhesive layer 127 side in accordance with one embodiment of the present invention. For fabrication efficiency, the TBGA packages of the embodiments described above are fabricated from a sheet of copper 702 defining a plurality of package sites. Although any number package sites may be provided, the present example contains four substantially identical package sites. As shown, ground plane strip 160' has a pair of symmetrically located sprocket holes 704 associated with each package site, and are advantageously used for aligning the flex tape interconnect substrate 150 during the assembly process. Two pairs of tooling holes 706 located at each of the four corners of package site are used by the solder ball placement and package singulation equipment for efficient fabrication. Preferably, the width "w" of the first adhesive is larger than the package body size, but about substantially the same width as the heat spreader 160'.

Figure 7B:
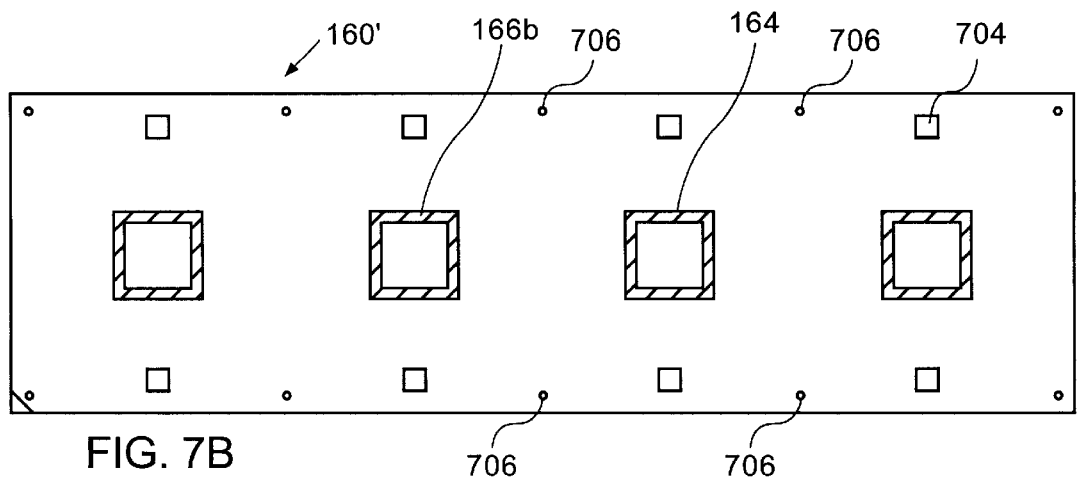
FIG. 7B is a bottom view of the ground plane strip used in the assembly of the ball grid array in accordance with one embodiment of the present invention.

FIG. 7B is a bottom view of the ground plane strip 160' and the silver plated ground ring 164 in accordance with one embodiment of the present invention. In fabrication, the rectangular opening 166*b* is mechanically stamped through the copper strip 702 for all package sites. Accordingly, when the rectangular opening 166*b* is stamped through, the underlying adhesive 127 is also punched through, thereby producing excellent alignment of the two apertures at a substantially low manufacturing cost.

Figure 7C:
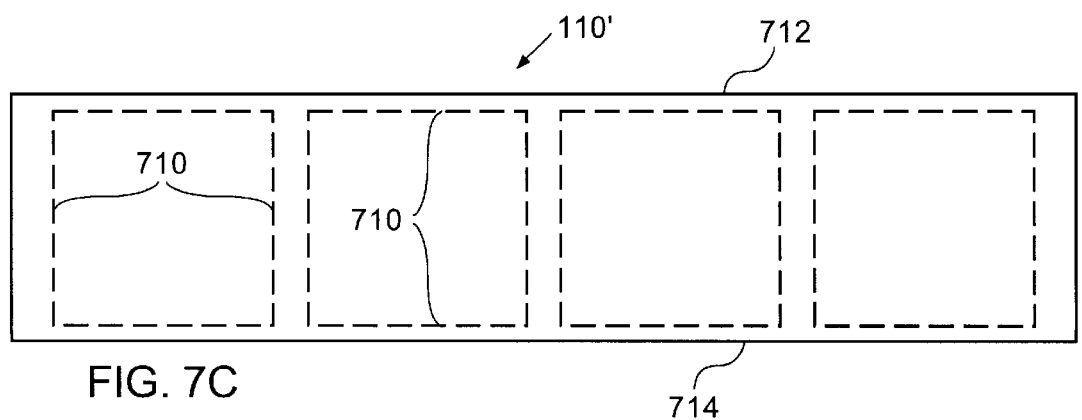
FIG. 7C is a top view of the heat spreader strip in accordance with one embodiment of the present invention.

FIG. 7C shows the heat spreader strip 110' having the same number of package sites as the ground plane strip 160', and also having substantially the same length as the ground plane strip 160'. The heat spreader strip 110' is preferably wider than the package body size 710 and has substantially the same width as the adhesive layer 127 defined by outlines 712 and 714. As mentioned above, the heat spreader strip 110' is a strip of copper preferably having both surfaces treated with black copper oxide to promote adhesion.

Following the fabrication process, the heat spreader strip 110' is then attached to the ground plane strip 160' having the adhesive layer 127. However, caution should be taken during the lamination process to avoid inclusion of air bubbles in the adhesive layer 127 once the heat spreader strip 110' is attached to the ground plane strip 160'. Once assembled, the resulting strip will have a cavity opening 166*b* formed by the ground plane 160 of each package site.

Figure 7D:
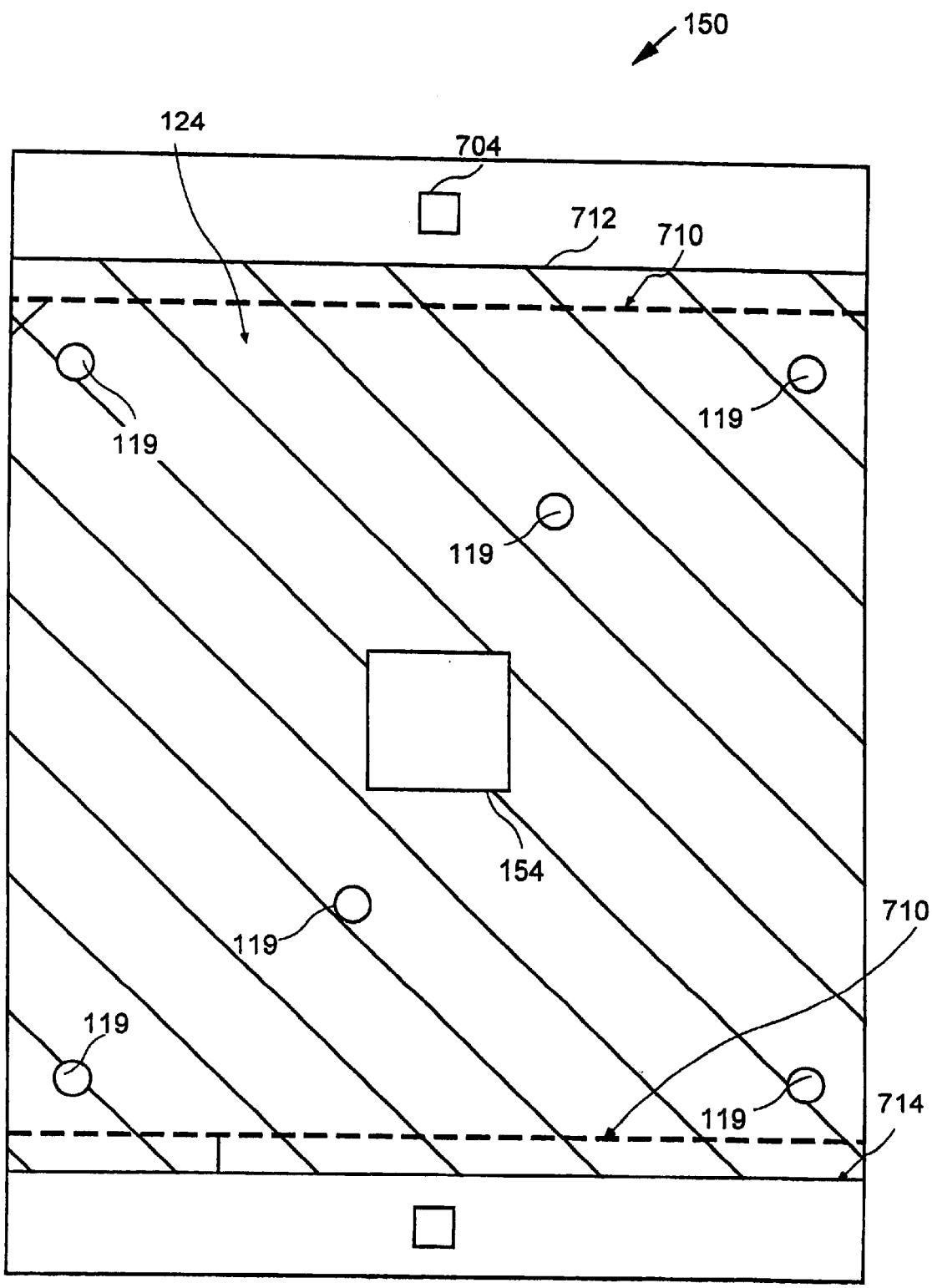
FIG. 7D is a top view of a single flex tape interconnect substrate with the second adhesive, sprocket holes, ground vias and the device aperture in accordance with one embodiment of the present invention.

For manufacturing efficiency, the flex tape interconnect substrate 150 can be arranged in a reel form having adhesive layer 127 in place. By way of example, FIG. 7D illustrates a top view of a single flex tape interconnect substrate 150 site that is ready to be assembled onto the ground plane strip 160'. The adhesive layer 124 width extends between lines 712 and 714 such that the sprocket holes 704 are free of adhesive and are available for the alignment operation with the sprocket holes 704 of the ground plane strip 160', yet the adhesive layer 124 is preferably wider than the package outline 710. Preferably, the flex tape interconnect substrate 150 is aligned in a punch tool using the two sprocket holes 704 that are symmetrically located on either side of the flex tape interconnect substrate 150. Next, the substrate sites 710 are singulated, the cavity openings 154 and vias are mechanically punched-out in a single operation using a suitable punch having the desired pattern. As a result, the punch cuts through the flex tape interconnect substrate 150 having the adhesive layer 124, thereby producing excellent alignment at a low manufacturing cost.

Next, the individual flex tape interconnect substrates 150 sites are aligned to the ground plane strip 160' package sites defined by outlines 710 using the sprocket holes 704. At this point, each flex tape interconnect substrate 150 is attached with the adhesive layer 124 to the ground plane strip 160'. However, caution should be taken to avoid inclusion of air bubbles in the adhesive layer 124.

Figure 7E:
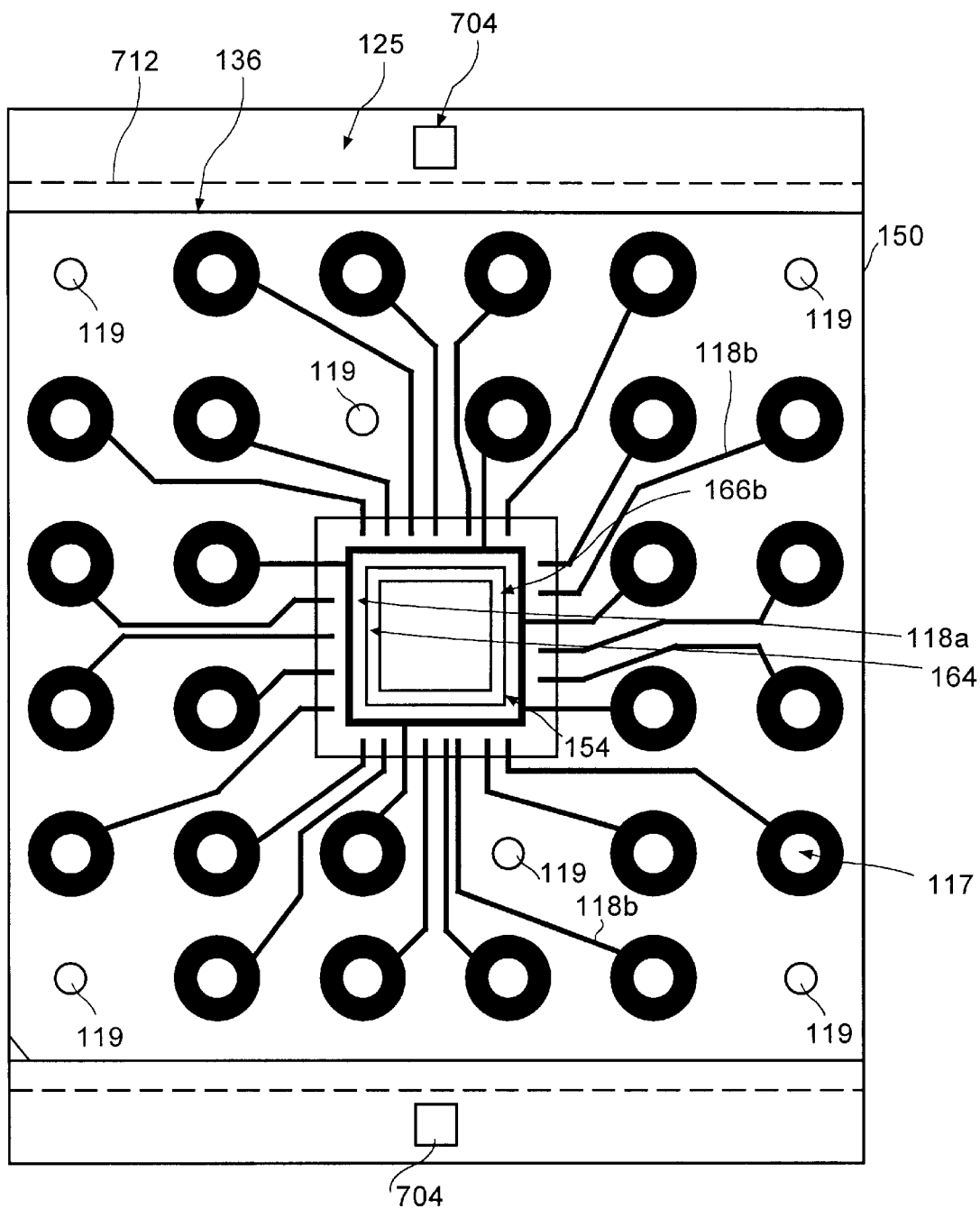
FIG. 7E is a bottom view of a single flex tape interconnect substrate attached to the ground plane in accordance with one embodiment of the present invention.
Figure 7F:
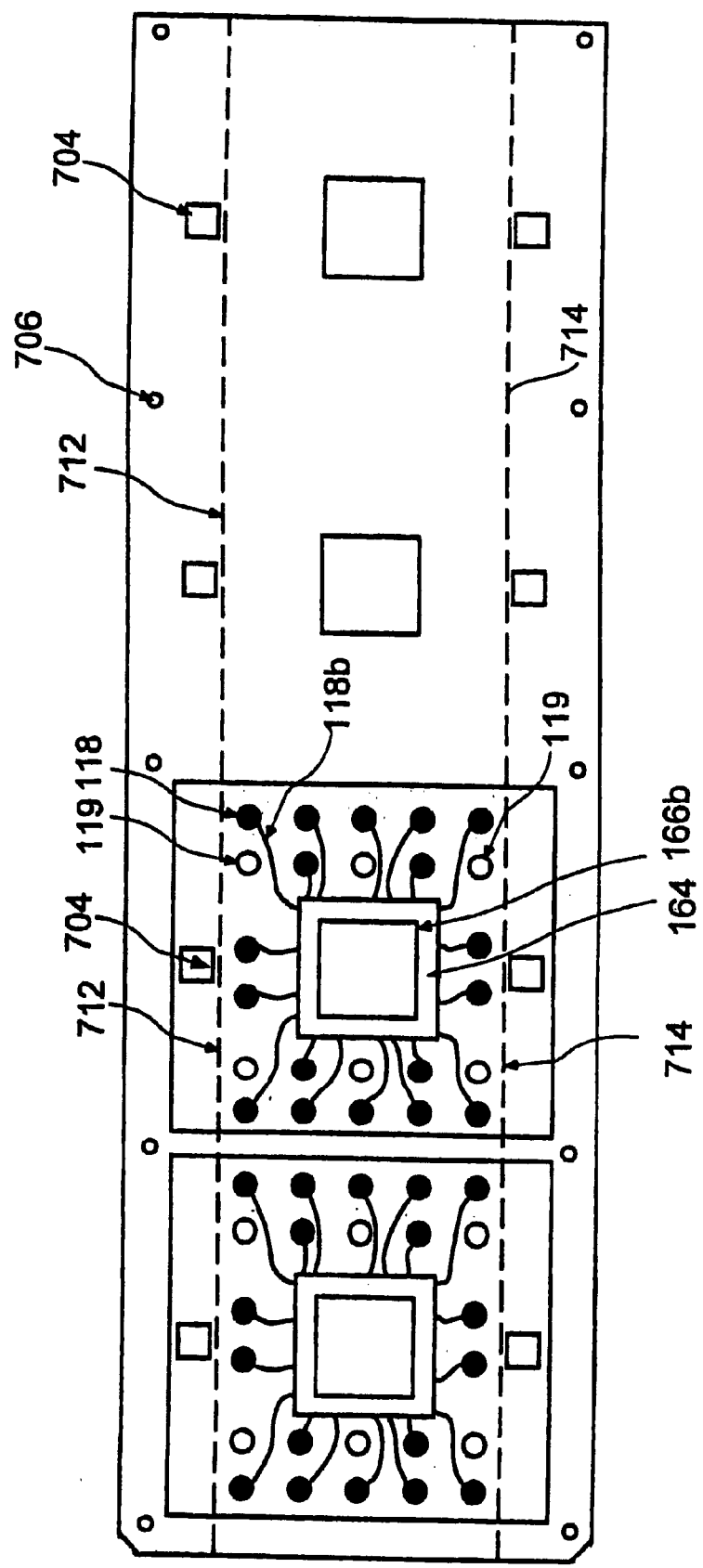
FIG. 7F is a bottom view of a partially assembled package strip with two flex tape interconnect substrate frames attached to the ground plane in accordance with one embodiment of the present invention.

FIG. 7E shows the bottom view of a single flex tape interconnect substrate 150 site that has been attached to the ground plane strip 160' in accordance with one embodiment of the present invention. The ground vias 119 are aligned to the ground plane, and the cavity opening 154 is aligned to the silver plated ground ring 164. FIG. 7F shows two singulated flex tape interconnect substrates 150 attached to the individual package sites 710 on the ground plane strip 160'. Also shown is an outline of the underlying heat spreader strip 110' defined by lines 712 and 714. The process discussed above will therefore continued until all package sites 710 on the ground plane strip 160' have an attached flex tape interconnect substrate 150.

With reference to FIG. 3A, the fabrication process continues by attaching the die 112 to the cavity of the individual package sites with the die attach epoxy 113, after which the die attach epoxy 113 is cured. As mentioned above, additional silver filled epoxy can be dispensed in the cavity to establish an electrical contact between the die 112 and the ground plane 160. The bond pads on the die are then interconnected to by wire bonds 126 to the fingers 118*e,* the power ring 118*a* and the ground ring 164 on the ground plane 160. Each cavity is then filled with the encapsulation compound 122 to a predetermined level and subsequently cured to protect the die 112, the wire bonds 126, and maintain a predetermined clearance "D" from the crown of the solder balls.

As mentioned earlier, solder balls are placed into the vias and then reflowed to fill the vias and form a substantially even surface. This provides an even surface for all pads during the next step of flux application. Generally, after the flux is applied, the solder balls 120 and 120*a* are placed on all the solder ball pads (i.e., those overlying a metal pad 117 and those overlying a solder ball filled ground via 119), and subsequently reflowed to form an electrical and metallurgical bond to the pads. As such, the ground solder balls 120*a* are in direct contact with the ground plane 160 and the remaining power and signal balls are in direct contact with the metal pads 117 of the flex tape interconnect substrates 150 as shown in FIG. 3A.

The packages are then singulated by punching the flex tape interconnect substrates 150, ground plane strip 160' and heat spreader strip 110', thereby defining the package perimeter 710 in one efficient fabrication step. As will be apparent to those skilled in the art, this efficient singulation ensures a clean package edge that has substantially no misalignments between the different package layers.

It should be understood that the above assembly process can be used for the first and third embodiments that implement the encapsulation 122. However, in the second embodiment where a lid 222 is used, the lid 222 is attached following the wire bonding operation. By way of example, a lid adhesive is first dispensed and then the lid 222 is attached and the epoxy is cured. The remaining steps are as described above.

The assembly process of the flip chip embodiment of FIGS. 6A through 6C, though similar to the process described above, differ in the following sequence of operations. The ground plane strip 160' does not have a silver plated ground ring 164, but otherwise is substantially the same as in the previous embodiments. Similarly the heat spreader strip 110' is substantially the same, and is assembled using the same process as in the previous embodiments. The bump pads 218a on the flex tape interconnect substrate 150" are fluxed, and the solder bumps 320 are aligned to the bump pads 218a. The solder bumps 320 are then reflowed to form a metallurgical and electrical bond to the flex tape interconnect substrate 150". Subsequently, the space between the die 112 and the flex tape interconnect substrate 150" is filled with the underfill epoxy 322 and cured. This provides a suitable protective coating for the die 112 and the solder bumps 320 from the environment as well as providing mechanical rigidity.

Continuing with the fabrication process of the flip chip arrangement of FIGS. 6A through 6C, the flex tape interconnect substrate 150" sites are singulated and the vias holes that are used to form ground vias 119 are punched in one step as in the previous embodiments. The die attach epoxy 113 is then dispensed in the cavity on the area that is to receive the die 112. The flex tape interconnect substrate 150" is then aligned to the ground plane strip 160' using the sprocket holes 704. The ground plane strip 160' having the flex tape interconnect substrate 150" sites is then attached to the ground plane strip 110' with the adhesive layer 127 and the die 112 is attached to the heat spreader strip 110' with the die attach epoxy 113 in the same operation. The die attach epoxy is subsequently cured to form a permanent bond. The individual packages are then singulated by a mechanical punching as in the previous embodiments.

The ball grid array packages described above can be manufactured by low cost methods using machinery, processes, materials and infrastructure common in the integrated circuit packaging industry. One such method uses the same assembly equipment, processes and support infrastructure used in the assembly of plastic ball grid arrays, which are well established in the packaging industry. By way of example, the use of strip assembly packaging implements assembly techniques that automatically assemble packages via magazine-to-magazine handling.

Although the foregoing invention has been described in some detail for purposes of clarity and understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a tape ball grid array semiconductor package, comprising:
   providing a ground plane strip having a plurality of package sites;
   stamping a first aperture through the ground plane for each of the plurality of package sites;
   joining the ground plane strip to a heat spreader strip;
   providing a one metal layer interconnect substrate;
   stamping a second aperture through the one metal layer interconnect substrate and at least one via hole;
   attaching one of the one metal layer interconnect substrate to each of the plurality of package sites on the ground plane strip, for each of the one metal layer interconnect substrates, the method further includes,
     filling the at least one via hole of the one metal layer interconnect substrate with a first solder ball;
     reflowing the first solder ball;
     placing a second solder ball over the reflowed first solder ball; and
     reflowing the second solder ball to attach the second solder ball to the reflowed first solder ball.

2. A method for making a tape ball grid array semiconductor package as recited in claim 1, wherein the stamping of the second aperture further includes,
   defining the second aperture to be larger than the first aperture through the interconnect substrate before the attaching of the interconnect substrate, such that the second aperture is substantially aligned with the first aperture.

3. A method for making a tape ball grid array semiconductor package as recited in claim 2, further comprising:
   applying an adhesive tape to a first side of the ground plane strip before the stamping of the first aperture through the ground plane for each of the plurality of package sites such that the adhesive tape is substantially simultaneously stamped through and aligned with the first aperture.

4. A method for making a tape ball grid array semiconductor package as recited in claim 1, further comprising:
   plating a wetable pattern on a second side of the ground plane before attaching the interconnect substrate to each of the plurality of package sites, the wetable pattern includes a wetable pad that is substantially aligned with the at least one via hole that is stamped through the interconnect substrate.

5. A method for making a tape ball grid array semiconductor package as recited in claim 4, wherein a first side of the interconnect substrate includes a substrate adhesive layer that is used in the attaching of the interconnect substrate to each of the plurality of package sites on the ground plane strip, and the stamping of the at least one via hole through the interconnect substrate at substantially the same time the second aperture in the interconnect substrate is stamped also substantially simultaneously stamps through the substrate adhesive layer.

6. A method for making a tape ball grid array semiconductor package as recited in claim 4, wherein the wetable pattern on the second side of the ground plane includes a ground ring plating surrounding the first aperture.

7. A method for making a tape ball grid array semiconductor package as recited in claim 6, further comprising:
   attaching a semiconductor die with a die attach epoxy within a cavity defined by the first and second apertures of each of the plurality of package sites.

8. A method for making a tape ball grid array semiconductor package as recited in claim 7, further comprising:
   wire bonding the semiconductor die of each of the plurality of package sites to at least one of a plurality of bonding fingers and a power ring that are electrically interconnected with conductive traces defined on a metal layer of a second side of the interconnect substrate.

9. A method for making a tape ball grid array semiconductor package as recited in claim 8, further comprising:

wire bonding the semiconductor die to the ground ring plating surrounding the first aperture of the ground plane.

10. A method for making a tape ball grid array semiconductor package as recited in claim 9, further comprising:

encapsulating the cavity defined by the first and second apertures of each of the plurality of package sites containing a wire bonded semiconductor die.

11. A method for making a tape ball grid array semiconductor package as recited in claim 10, further comprising:

attaching solder balls to a plurality of conductive ball pads defined on the metal layer of the second side of the interconnect substrate;

reflowing the ball grid array semiconductor package to form an electrical and metallurgical contact with the conductive ball pads.

12. A method for making a tape ball grid array semiconductor package as recited in claim 11, further comprising:

singulating the heat spreader strip, the ground plane strip with a punch to form a complete package.

13. A method for making a semiconductor package, comprising:

providing a ground plane;

stamping a first aperture through the ground plane;

joining the ground plane to a heat spreader;

providing a one metal layer interconnect substrate;

stamping a second aperture through the one metal layer interconnect substrate and at least one via hole;

attaching the one metal layer interconnect substrate to the ground plane, the method further includes,
filling the at least one via hole of the one metal layer interconnect substrate with a first solder ball;
reflowing the first solder ball;
placing a second solder ball over the reflowed first solder ball; and
reflowing the second solder ball to attach the second solder ball to the reflowed first solder ball.

14. A method for making a semiconductor package as recited in claim 13, wherein the stamping of the second aperture further includes, defining the second aperture to be larger than the first aperture through the interconnect substrate before the attaching of the interconnect substrate, such that the second aperture is substantially aligned with the first aperture.

15. A method for making a semiconductor package as recited in claim 14, further comprising:

applying an adhesive tape to a first side of the ground plane before the stamping of the first aperture through the ground plane such that the adhesive tape is substantially simultaneously stamped through and aligned with the first aperture.

16. A method for making a semiconductor package as recited in claim 13, further comprising:

plating a wetable pattern on a second side of the ground plane before attaching the interconnect substrate, the wetable pattern includes a wetable pad that is substantially aligned with the at least one via hole that is stamped through the interconnect substrate.

17. A method for making a semiconductor package as recited in claim 16, wherein a first side of the interconnect substrate includes a substrate adhesive layer that is used in the attaching of the interconnect substrate to the ground plane, and the stamping of the at least one via hole through the interconnect substrate at substantially the same time the second aperture in the interconnect substrate is stamped also substantially simultaneously stamps through the substrate adhesive layer.

18. A method for making a semiconductor package as recited in claim 16, wherein the wetable pattern on the second side of the ground plane includes a ground ring plating surrounding the first aperture.

19. A method for making a semiconductor package as recited in claim 18, further comprising:

attaching a semiconductor die with a die attach epoxy within a cavity defined by the first and second apertures.

20. A method for making a semiconductor package as recited in claim 19, further comprising:

wire bonding the semiconductor die to at least one of a plurality of bonding fingers and a power ring that are electrically interconnected with conductive traces defined on a metal layer of a second side of the interconnect substrate.

21. A method for making a semiconductor package as recited in claim 20, further comprising:

wire bonding the semiconductor die to the ground ring plating surrounding the first aperture of the ground plane.

22. A method for making a semiconductor package as recited in claim 21, further comprising:

encapsulating the cavity defined by the first and second apertures of each of the plurality of package sites containing a wire bonded semiconductor die.

23. A method for making a semiconductor package as recited in claim 22, further comprising:

attaching solder balls to a plurality of conductive ball pads defined on the metal layer of the second side of the interconnect substrate, and the second solder ball is reflowed at the same time the solder balls that are attached to the plurality of conductive ball pads is reflowed.

24. A method for making a semiconductor package as recited in claim 23, wherein the method forms a tape ball grid array (TBGA) package.

* * * * *